United States Patent [19]
Noguchi et al.

[11] Patent Number: 6,071,765
[45] Date of Patent: *Jun. 6, 2000

[54] METHOD OF FORMING POLYCRYSTALLINE SILICON LAYER ON SUBSTRATE AND SURFACE TREATMENT APPARATUS THEREOF

[75] Inventors: Takashi Noguchi; Tohru Ogawa; Yuji Ikeda, all of Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/915,269

[22] Filed: Aug. 20, 1997

Related U.S. Application Data

[62] Division of application No. 08/463,962, Jun. 5, 1995, Pat. No. 5,869,803, which is a division of application No. 08/332,758, Nov. 1, 1994, Pat. No. 5,529,951.

[30] Foreign Application Priority Data

| Nov. 2, 1993 | [JP] | Japan | 5-297399 |
| Feb. 23, 1994 | [JP] | Japan | 6-049801 |

[51] Int. Cl.⁷ .................................................. H01L 21/00
[52] U.S. Cl. ......................... 438/166; 438/149; 438/308
[58] Field of Search .................................... 438/166, 308, 438/535, 795, 487, FOR 333, FOR 334, 149; 148/DIG. 90–DIG. 93

[56] References Cited

U.S. PATENT DOCUMENTS

| 4,469,551 | 9/1984 | Laude | 438/487 |
| 4,724,219 | 2/1988 | Ridinger | 438/535 |
| 4,784,963 | 11/1988 | Krimmel et al. | 438/535 |
| 5,162,239 | 11/1992 | Winer et al. | 438/487 |
| 5,180,690 | 1/1993 | Czubatyj et al. | |
| 5,294,811 | 3/1994 | Aoyama et al. | 257/59 |
| 5,372,836 | 12/1994 | Imahashi et al. | 438/487 |
| 5,413,958 | 5/1995 | Imahashi et al. | |
| 5,424,244 | 6/1995 | Zhang et al. | 438/535 |
| 5,561,081 | 10/1996 | Takenouchi et al. | 437/487 |
| 5,688,715 | 11/1997 | Sexton et al. | 438/535 |

FOREIGN PATENT DOCUMENTS

| 62-193177 | 8/1987 | Japan . |
| 62-193177 | 2/1988 | Japan . |
| 5-102062 | 4/1993 | Japan . |
| 5-102062 | 8/1993 | Japan . |
| 6-61172 | 3/1994 | Japan . |

OTHER PUBLICATIONS

T. Sugii et al., Appl. Phys. Lett. 45(9)(Nov. 1984)966 "ELE nitridation . . . ".

Toshihiro sugaii, Takashi Ito, and Hajime Ishikawa, "Excimer Laser enhanced Nitridation of silicon Substrates", Appl. Phys. Lett. 45 (9) p966, Nov. 1, 1984.

*Primary Examiner*—Charles Bowers
*Assistant Examiner*—Martin Sulsky
*Attorney, Agent, or Firm*—Hill & Simpson

[57] ABSTRACT

A method of forming a polycrystalline silicon thin film improved in crystallinity and a channel of a transistor superior in electrical characteristics by the use of such a polycrystalline silicon thin film. An amorphous silicon layer of a thickness preferably of 30 nm to 50 nm is formed on a substrate. Next, substrate heating is performed to set the amorphous silicon layer to preferably 350° C. to 500° C., more preferably 350° C. to 450° C. Then, at least the amorphous silicon layer is irradiated with laser light of an excimer laser energy density of 100 mJ/cm² to 500 mJ/cm², preferably 280 mJ/cm² to 330 mJ/cm², and a pulse width of 80 ns to 200 ns, preferably 140 ns to 200 ns, so as to directly anneal the amorphous silicon layer and form a polycrystalline silicon thin film. The total energy of the laser used for the irradiation of excimer laser light is at least 5 J, preferably at least 10 J.

23 Claims, 27 Drawing Sheets

0.1 μm

SINGLE SHOT
EXPOSURE AT
280mJ/cm²
80nm, 400°C 0.1 μm

SINGLE SHOT
EXPOSURE AT
350mJ/cm²
80nm, 400°C

SINGLE SHOT
EXPOSURE AT
220mJ/cm²
80nm, 400°C

SINGLE SHOT
EXPOSURE AT
300mJ/cm²
40nm, 400°C 0.1μm

SINGLE SHOT
EXPOSURE AT
350mJ/cm²
40nm, 400°C 0.1μm

SINGLE SHOT
EXPOSURE AT
150 mJ/cm²
40 nm, 400°C 0.1 μm

SINGLE SHOT
EXPOSURE AT

80nm
RT, 350mJ/cm²

0.1 μm

TEN TIMES
SHOTS
EXPOSURE AT

80nm
RT, 350mJ/cm²

0.1 μm

100 SHOTS
EXPOSURE AT

80nm
RT, 350mJ/cm²

0.1 μm

SINGLE SHOT
EXPOSURE AT

40nm
400°C, 350mJ/cm²

0.1μm

SINGLE SHOT
EXPOSURE AT
80nm
400°C, 350mJ/cm²

0.1 μm

SINGLE SHOT
EXPOSURE AT
RT
40nm, 300mJ/cm$^2$ 0.1 μm

SINGLE SHOT
EXPOSURE AT
400°C
40nm, 300mJ/cm$^2$ 0.1 μm

SINGLE SHOT
EXPOSURE AT
RT
80nm, 350mJ/cm$^2$ 0.1 μm

SINGLE SHOT
EXPOSURE AT
400°C
80nm, 350mJ/cm$^2$

METHOD OF FORMING POLYCRYSTALLINE SILICON LAYER ON SUBSTRATE AND SURFACE TREATMENT APPARATUS THEREOF

CROSS-REFERENCE TO RELATED APPLICATIONS

This application is a Divisional of application Ser. No. 08/463,962, filed Jun. 5, 1995 now U.S. Pat. No. 5,869,803, which is a divison of Ser. No. 08/332,758, filed Nov. 1, 1994, now U.S. Pat. No. 5,529,951.

BACKGROUND OF THE INVENTION

1. Field of the Invention

The present invention relates to a surface treatment method and a surface treatment apparatus.

More particularly, the present invention relates to a method of forming a thin layer of polycrystalline silicon on a substrate, and to a method of forming a channel of a metal insulation semiconductor (MIS) transistor using the method of forming a thin layer of polycrystalline silicon. Also, more particularly, the present invention relates to a surface treatment apparatus such as a laser light emitting apparatus adaptive to perform, for example, a laser light annealing treatment, where the area of irradiation by a single shot of laser light is relatively large and an energy density of irradiated laser light is high, to thereby form, for example, a thin layer of polycrystalline silicon from an amorphous silicon layer.

2. Description of Related Art

First, the formation of a thin layer (film) of polycrystalline silicon on a substrate of a transistor will be described.

Thin film transistors (hereinafter referred to as TFTs) using amorphous silicon or polycrystalline silicon thin films are used for the transistors for driving pixels in liquid crystal displays, the transistors of peripheral elements, load element type static RAMs (hereinafter referred to as SRAMs), etc.

Polycrystalline silicon, however, has a higher density of unbonded arms of silicon atoms compared with monocrystalline silicon, so these unbonded arms become the cause of generation of a leakage current at the time the transistors are switched off. As a result, they become a cause of a reduced operating speed at the time of switching the transistors on. Accordingly, to improve the characteristics of a TFT, it is demanded to form a polycrystalline silicon thin film with few crystal defects and superior uniformity. As a method for formation of such a polycrystalline silicon thin film, the chemical vapor deposition method and the solid-state deposition method have been proposed. As the means for reducing the unbonded arms causing leakage current etc., use is made of the hydrogenation technique of doping hydrogen in the polycrystalline silicon thin film so as to cause hydrogen to bond with the unbonded arms.

If the chemical vapor deposition method is used for growing large grain size crystals and forming a polycrystalline silicon thin film, however, the thickness becomes nonuniform. With the chemical vapor deposition method, it is difficult to obtain a polycrystalline silicon thin film with a uniform thickness. Accordingly, it becomes difficult to form transistors with uniform device characteristics using a polycrystalline silicon thin film.

Further, with the solid-state deposition method, it is possible to grow dendrites and form a crystal with a grain size of at least 1 μm, but the dendrites include small defects such as dislocation and twins which act as traps to obstruct improvement of characteristics and destabilize the operation.

To reduce the grain boundary trap density due to the unbonded arms, there has been proposed the method of performing annealing treatment using excimer laser light. Excimer laser light has the advantage of a large coefficient of absorption in silicon due to the UV light and can heat just the area near the surface of the silicon. Accordingly, there is no effect on the underlying layer, i.e., glass substrate, bottom layer LSI bonding portion, etc.

As methods for excimer laser annealing, there is known, first, the method of direct annealing of the amorphous silicon film and, second, the method of annealing by excimer laser light by an energy density at which the film as a whole will not melt.

The former method of direct annealing of the amorphous silicon is simpler as a process compared with the latter method and is advantageous for the future mass production of LSIs. Further, if a large area can be annealed by a single irradiation of the excimer laser light, this would be further advantageous for mass production.

When use is made of such excimer laser for directly annealing an amorphous silicon film, however, it is difficult to obtain an excimer laser beam able to cover a large area in a single shot and having in-plane uniformity sufficient for obtaining a polycrystalline silicon thin film having a low grain boundary trap density and a good crystallinity. To make up for this, an excimer laser having a large output energy able to anneal a large area with a single shot has been under development in recent years. Further, to improve the effect of the excimer laser annealing, it has been considered to heat the substrate to several hundred degrees for direct annealing of the amorphous silicon, but the process conditions for obtaining a polycrystalline silicon thin film having a low grain boundary trap density and good crystallinity have not been specified.

Further, in the above method of direct annealing of amorphous silicon, the grain size of the polycrystalline silicon was less than an average 50 nm.

Next, a surface treatment apparatus will be described.

When annealing a shallow region of a semiconductor substrate, use is made of a surface treatment apparatus which is provided with a laser emitting laser light of a short wavelength, for example, xenon chloride excimer laser light of a wavelength of 308 nm. The energy of the laser light emitted from a conventional excimer laser apparatus, however, is low, so it is not possible to anneal a wide area of about 30 mm×30 mm with a single shot of laser light.

Accordingly, to perform laser annealing of a wide area, the practice has been to form the laser light into a beam of for example about 0.6 cm×0.6 cm to raise the energy density to about 0.9 J/cm$^2$ and to scan the annealing region with continuously emitted pulses of laser light.

If laser annealing is performed by this method, however, the time for the annealing treatment becomes extremely long.

As shown in the explanatory view of the state of irradiation of laser light in FIG. 1, since the laser light 121 is irradiated in several pulses, the portion 141 connecting the region 131a irradiated by one shot of laser light 121a (121) and the region 131b irradiated by the next shot of laser light 121b (121) becomes discontinuous in terms of the amount of energy irradiated. Further, as shown by the graph of the density of irradiated energy and the irradiation position of FIG. 1, the laser emission output fluctuates among the shots 121c, 121d, and 121e, so the uniformity of the annealing treatment becomes poor in some parts. Therefore, it was difficult to apply this technique to manufacturing processes of polycrystalline silicon thin films.

SUMMARY OF THE INVENTION

An object of the present invention is to provide a surface treatment apparatus and surface treatment method superior for annealing treatment, diffusion treatment, oxidation treatment, nitridization treatment, and other surface treatment by mounting a high output laser and irradiating a broad area with a single shot of laser light.

Another object of the present invention is to provide a method of forming a thin layer of polycrystalline silicon which improves the crystallinity.

Still another object of the present invention is to provide a method of forming a channel of a transistor superior in electrical characteristics.

According to the present invention, thereis provided a method of forming a thin layer of polycrystalline silicon on a substrate, including: (a) a first step for forming an amorphous silicon layer on the substrate; (b) a second step for exposing laser light to the heated amorphous silicon layer in an extent greater than approximately 10 $cm^2$ by single shot exposure, the laser light having an energy density of approximately 100 $mJ/cm^2$ to 500 $mJ/cm^2$. Preferably, the laser light is emitted from a laser light emitting apparatus which has a total energy equal to or greater than 5 J.

The substrate may be heated to heat the amorphous silicon layer at approximately 350° C. to 500° C.

More preferably, the method of forming a thin layer of polycrystalline silicon on a substrate, further includes a third step for forming a light reflection prevention film on a surface of the formed amorphous silicon layer, before performing the third step.

Preferably, in the second step, the exposure is carried out by the laser light having the energy density of approximately 100 $mJ/cm^2$ to 230 $mJ/cm^2$.

Also, preferably, in the second step, the single shot exposure is carried out by laser light having a duration of approximately 80 ns to 200 ns.

Also, according to the present invention there is provided a method of manufacturing a MIS transistor, including the following steps of: (a) forming an amorphous silicon layer on a substrate of a metal insulation silicon transistor; and (b) forming a channel region on the substrate, by exposing laser light, having an energy density of approximately 100 $mJ/cm^2$ to 500 $mJ/cm^2$ and emitted from a laser-light emitting apparatus having a total energy equal to or greater than 5 J, on the heated amorphous silicon layer in an extent greater than 10 $cm^2$ by single shot exposure to thereby transform the amorphous silicon layer into a polycrystalline silicon thin layer functioning as a channel region of the transistor.

Preferably, in the step for forming a channel region, the amorphous silicon layer is heated at approximately 350° C. to 500° C.

Further, according to the present invention, there is provided a surface treatment apparatus comprises: a laser for emitting laser light; an attenuator provided in a first optical path of the laser light emitted from the laser; a scanning laser light generating means provided in a second optical path of the laser light passing through the attenuator and sweeping the laser light from the attenuator to generate scanning laser light; a beam homogenizer provided in a third optical path of the scanning laser light from the scanning laser light generating means and homogenizing the scanning laser light; a chamber provided at a position irradiated by the laser light passing through the beam homogenizer; and a stage placing a workpiece therein and provided at a position irradiated by the laser light incident into the chamber.

Preferably, the laser emits laser light of at least 2 J/pulse or at least 2 W.

The scanning laser light generating means may comprise: a first reflection mirror provided in the first optical path of the laser light passing through the attenuator; a second reflection mirror provided in the second optical path of the laser light reflected by the first reflection mirror; a first rail on which the first reflection mirror is mounted and provided along a line of the x-axial direction as an optical axis of the laser light reflected by the first reflection mirror; a first support which is mounted to reciprocally move with respect to the first rail and supports the second reflection mirror and the beam homogenizer; a second rail which is provided along a line of the y-axial direction as another optical axis of the laser light reflected by the first reflection mirror; and a second support which is mounted to reciprocally move with respect to the second rail and supports the first rail.

Preferably, the surface treatment apparatus may further comprise a first drive unit for causing reciprocal movement of the first support along the first rail, and a second drive unit for causing reciprocal movement of the second support along the second rail.

More preferably, a condenser lens, a reticle, and a projection lens may be provided in the third optical path of the laser light passed the beam homogenizer. Alternatively, a condenser lens, a reticle, and a reflection optical system may be provided in the third optical path of the laser light passed through the beam homogenizer.

Preferably, the stage comprises x-axis and y-axis stages movable in two orthogonal axial directions, an x-axial direction drive unit for driving the x-axis stage, and a y-axial direction drive unit for driving the y-axis stage.

The surface treatment apparatus may comprise an alignment means including: (a) a length measuring device for determining the positions of the x-axis and y-axis stages; (b) a target detector for detecting a target formed on the workpiece on the x-axis and y-axis stages and arranged at a position enabling irradiation of detection light to the target; (c) a computation processing unit for performing processing of computations based on a target signal received by the target detector and instructing the amounts of positional control of the x-axis and y-axis stages; and (d) a drive control unit for instructing the amounts of movement of the x-axis and y-axis stages to the x-axial direction drive unit and the y-axial direction drive unit based on the amounts of positional control instructed from the computation processing unit and the positions of the z-axis and y-axis stages determined by the length measuring device.

Alternatively, the surface treatment apparatus may comprise an alignment means, including: (a) a length measuring device for determining the position of the beam homogenizer; (b) a target detector for detecting a target formed on the workpiece on the stage and arranged at a position enabling irradiation of the detection light to the target; (c) a computation processing unit for performing processing of computations based on a target signal received by the target detector and instructing the amount of positional control of the beam homogenizer; and (d) a drive control unit for instructing the amount of movement of the beam homogenizer to the first and second drive units based on the amount of positional control instructed from the computation processing unit and the position of the beam homogenizer determined by the length measuring device.

Preferably, the surface treatment apparatus further comprise an adjustment means for adjusting laser emission output. The adjustment means includes: (a) a photodetector for detecting the intensity of the laser light emitted from the laser oscillator; (b) an output controller for instructing an intensity of laser light corresponding to the change of a signal obtained by the photodetector; and (c) a voltage controller for receiving instructions from the output controller and controlling the emission voltage of the laser oscillator.

Alternatively, the adjustment means includes: (a) a photodetector for detecting the intensity of laser light emitted from the laser oscillator; (b) a controller for instructing an intensity of laser light corresponding to the change of a signal obtained by the photodetector; and (c) an attenuator controller for receiving instructions from the controller and adjusting the angle of reception of light of the attenuator.

Preferably, the beam homogenizer comprise a fly's eye lens provided in the third optical path of the laser light, and a condenser lens provided in the third optical path of the laser light passed through the fly's eye lens.

Alternatively, the beam homogenizer comprise a beam expander provided in the third optical path of the laser light, a prism having a planar inner side and having an annular inclined face at the outer periphery and provided in the third optical path of the laser light passing through the beam expander, and a condenser lens for condensing the laser light split by the prism and provided in the third optical path of the laser light passed through the prism.

Also, alternatively, the beam homogenizer comprise a beam expander provided in the third optical path of the laser light, and a prism having a convex conical face and provided in the optical path of the laser light passed through the beam expander.

More preferably, the surface treatment apparatus may further comprise a shutter blocking the laser light for temporarily opening the optical path of the laser light, is provided in the optical path of the laser light.

According to the present invention, there is further provided a surface treatment method, including:

(a) a first step for placing a workpiece on a chamber provided in a surface treatment apparatus, the surface treatment apparatus comprising: a laser oscillator emitting laser light; an attenuator provided in a first optical path of the laser light emitted from the laser oscillator; a scanning laser light generating means provided in a second optical path of the attenuated laser light from the attenuator and sweeping the same to generate a scanning laser light; a beam homogenizer provided in a third optical path of the scanning laser light and homogenizing the scanning laser light; and a chamber provided at a position to which the homogenized laser light is exposed, and the workpiece being arranged in the chamber;

(b) a second step for making the inside of the chamber a predetermined atmospheric condition; and (c) a third step for exposing the laser light from the beam homogenizer to the workpiece in the chamber.

Specifically, the second step includes a step for making the inside of the chamber an atmospheric condition suitable for to annealing and wherein the third step includes a step for annealing the workpiece by the laser light exposure.

More specifically, the second step includes a step for making the inside of the chamber an atmospheric condition suitable for diffusing an impurity into the workpiece, and the third step includes a step for introducing the impurity contained in the chamber into the workpiece.

Also specifically, the second step includes a step for making the inside of the chamber an atmospheric condition suitable for of oxidization or nitridization and the third step includes a step for forming an oxide layer or a nitride layer on a surface of the workpiece.

BRIEF DESCRIPTION OF THE DRAWINGS

These and other objects and features of the present invention will become clearer from the following description of preferred embodiments with reference to the accompanying drawings, in which.

DESCRIPTION OF THE PREFERRED EMBODIMENTS

Preferred embodiments of the present invention will be described with reference to the drawings.

SURFACE TREATMENT APPARATUS

An embodiment of a laser light emitting apparatus in accordance with the present invention, i.e., a surface treatment apparatus, will be described with reference to the schematic view of the configuration given in FIG. 3.

Figure 3:
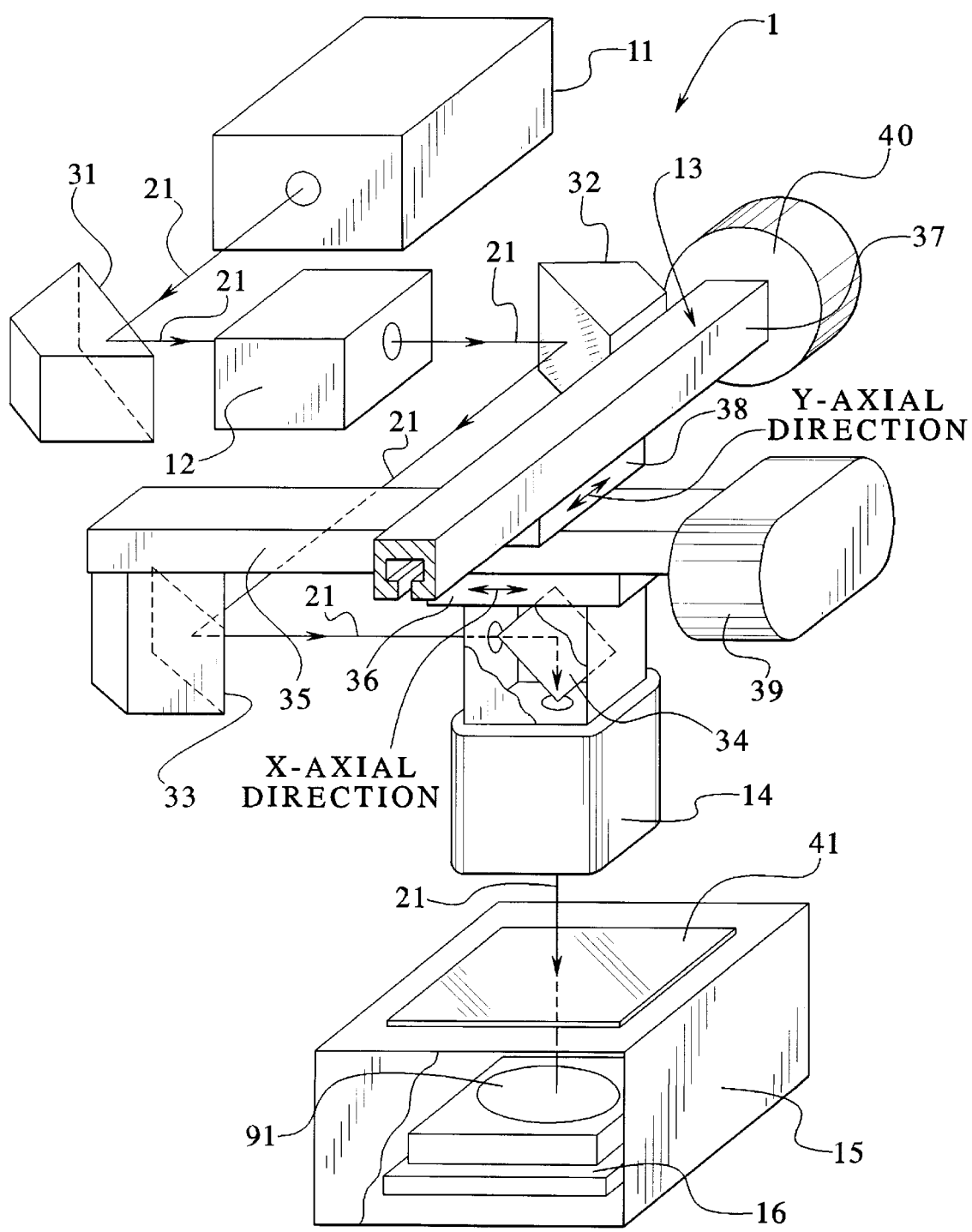
FIG. 3 is a schematic view of the configuration of an embodiment of a surface treatment apparatus according to the present invention.

In FIG. 3, a surface treatment apparatus 1 is provided with a laser device 11 for emitting laser light 21. The laser device 11 emits laser light by X-ray excitation and has an energy per pulse of for example at least 2 J. The laser light 21 is for example emitted in the Gaussian mode.

As the above-mentioned laser device 11, for example, use is made of an excimer laser for emitting rare gas halide excimer laser light, such as xenon chloride laser light of a wavelength of 308 nm, krypton fluoride laser light of a wavelength of 249 nm, or argon fluoride light of a wavelength of 193 nm. Or, as the laser device 11, use is made of a solid laser emitting laser light such as YAG ($Y_3Al_5O_{12}$) laser light of a wavelength of 1.06 $\mu$m or glass laser light of a wavelength of 1.06 $\mu$m Alexandrite ($BeAl_2O_4$) laser light of a wavelength of 0.70 $\mu$m to 0.82 $\mu$m.

Note that when using the higher harmonics of laser light emitted by the laser device 11, provision is made of a higher harmonic generator (not shown) in the laser device 11. In this case, for example, with a laser emitting YAG laser light (wavelength of 1.06 $\mu$m), it is possible to obtain the third harmonics (wavelength of 266 nm).

Further, the above-mentioned laser device 11 may be one which emits the laser light 21 in pulses or one which emits it continuously. One which emits pulses, as explained above, is comprised of a laser oscillator which has a pulse energy of at least 2 J. Further, one which emits continuously is comprised of a laser oscillator having an output of at least 2 W.

In a first optical path of the laser light 21 emitted from the laser device 11, provision is made of an attenuator 12 through a reflection mirror 31. The reflection mirror 31 is provided at a position guiding (directing) the laser light 21 to the attenuator 12. The attenuator 12 is comprised for example of a quartz substrate on which is formed a dielectric thin film. The attenuator 12, further, is provided with a rotation drive unit (not shown) able to change the angle of the irradiated face with respect to the incident laser light 21. This rotation drive unit is comprised for example of a pulse motor and speed changer.

In a second optical path of the laser light 21 after passing through the attenuator 12, further, provision is made, through a reflection mirror 32, of a laser light scanning means 13 for scanning by the laser light 21 in the x- and y-directions. The reflection mirror 32 is provided at a position guiding (directing) the laser light 21 to the laser light scanning means 13. The laser light scanning means 13 is provided with a first reflection mirror 33 and a second reflection mirror 34. The first reflection mirror 33 is provided in the optical path of the laser light 21 after reflected by the reflection mirror 32. The second reflection mirror 34 is provided in the optical path of the laser light 21 after reflected by the first reflection mirror 33.

In a third optical path of the laser light 21 emitted from the laser light scanning means 13, provision is made of a beam homogenizer 14. The beam homogenizer 14 converts the mode of the laser light 21 of the Gaussian mode emitted from the laser device 11 so that the intensity of the laser light in the diametrical direction of the flux becomes substantially uniform.

The first reflection mirror 33 is provided in the optical path of the laser light 21 after passing through the attenuator 12 and reflected at the reflection mirror 32. The second reflection mirror 34 is provided in the optical path of the laser light 21 after reflected by the first reflection mirror 33.

Along the optical axis of the laser light 21 reflected by the first reflection mirror 33, that is, the x-axial direction, provision is made of a first rail 35 to which the first reflection mirror 33 is attached (mounted). The first rail 35 has attached to it movable back and forth (to reciprocally move) a first support 36 supporting the second reflection mirror 34 and the above-mentioned beam homogenizer 14.

Along the optical axis of the laser light 21 incident on the first reflection mirror 33, that is, the y-axial direction, provision is made of a second rail 37. The second rail 37 has attached to it movable back and forth (to reciprocally move) a second support 38 supporting the first rail 35.

Further, a first drive unit 39 connected to the first support 36 through a first drive shaft (not shown) is provided at the end portion of the first rail 35. This first drive unit 39 moves the first support 36 back and forth along the first rail 35. Further, a second drive unit 40 connected to the second support 38 through a second drive shaft (not shown) is provided at the end portion of the second rail 37 for example. This second drive unit 40 moves the second support 38 back and forth along the second rail 37.

A chamber 15 is provided in the optical path of the laser light 21 after passing through the beam homogenizer 14. Inside the chamber 15, there is provided a stage 16 on which a workpiece 91 is placed. The stage 16 is provided with for example a prealignment mechanism (not shown). This prealignment mechanism is for making a positioning part formed on the workpiece 91, for example, an orientation flat or notch of the wafer, be positioned in a predetermined direction. As the method of positioning using as a reference the outer shape of the workpiece 91, there is known the method of mechanically making the positioning part register with a reference part (not shown) formed on the stage 16 and the method of making the positioning part register with a reference part (not shown) formed on the stage 16 using a photodetector.

Further, provision is made of a laser light passage window 41 for passing the laser light 21 at the side of the chamber 15 irradiated by the laser light 21. This laser light passage window 41 is comprised for example of quartz glass. Further, the stage 16 is comprised for example of x-axis and y-axis stages movable in the x-axial direction and y-axial direction by servo motors (not shown). It may also be comprised of fixed stages.

Note that a projection lens (not shown) may be provided in the optical path of the laser light 21 between the beam homogenizer 14 and the chamber 15.

The surface treatment apparatus 1 is comprised as explained above.

In the surface treatment apparatus 1 of the above-mentioned configuration, the laser light 21 is emitted by the laser device 11 and the amount of the laser light 21 is adjusted by the attenuator 12. Further, since provision is made of the laser light scanning means 13, the laser light 21 can be made to scan the desired irradiation position. Further, since provision is made of the beam homogenizer 14, the intensity of the laser light in the diametrical direction of the flux of the laser light 21 is made substantially uniform. Also, since provision is made of the chamber 15, the workpiece 91 may be subjected to surface treatment by irradiation of the laser light 21 on the workpiece 91 placed in a specific atmosphere, for example, a vacuum, oxidizing atmosphere, nitriding atmosphere, atmosphere including diffusion impurities, etc.

In the laser device 11, the laser light 21 at the time of emission has an energy of at least 2 J/pulse, so surface treatment of a wide area, for example about 1 $cm^2$ or more, by irradiation of a single shot of the laser light 21 becomes possible. Such surface treatment includes for example an annealing treatment, diffusion treatment, oxidation treatment, nitridization treatment, etc.

In the laser light scanning means 13, the first support 36 supporting the second reflection mirror 34 and the beam homogenizer 14 can be moved (reciprocally) back and forth along the first rail 35 provided in the x-axial direction by, for example, the first drive unit 39. Further, the second support 38 supporting the first rail 35 and the first reflection mirror 33 can be moved back and forth along the second rail 37 provided in the y-axial direction by for example the second drive unit 40. Accordingly, the laser light 21 after passing through the beam homogenizer 14 may be made to scan anywhere in the x-axial direction and the y-axial direction.

Figure 4:
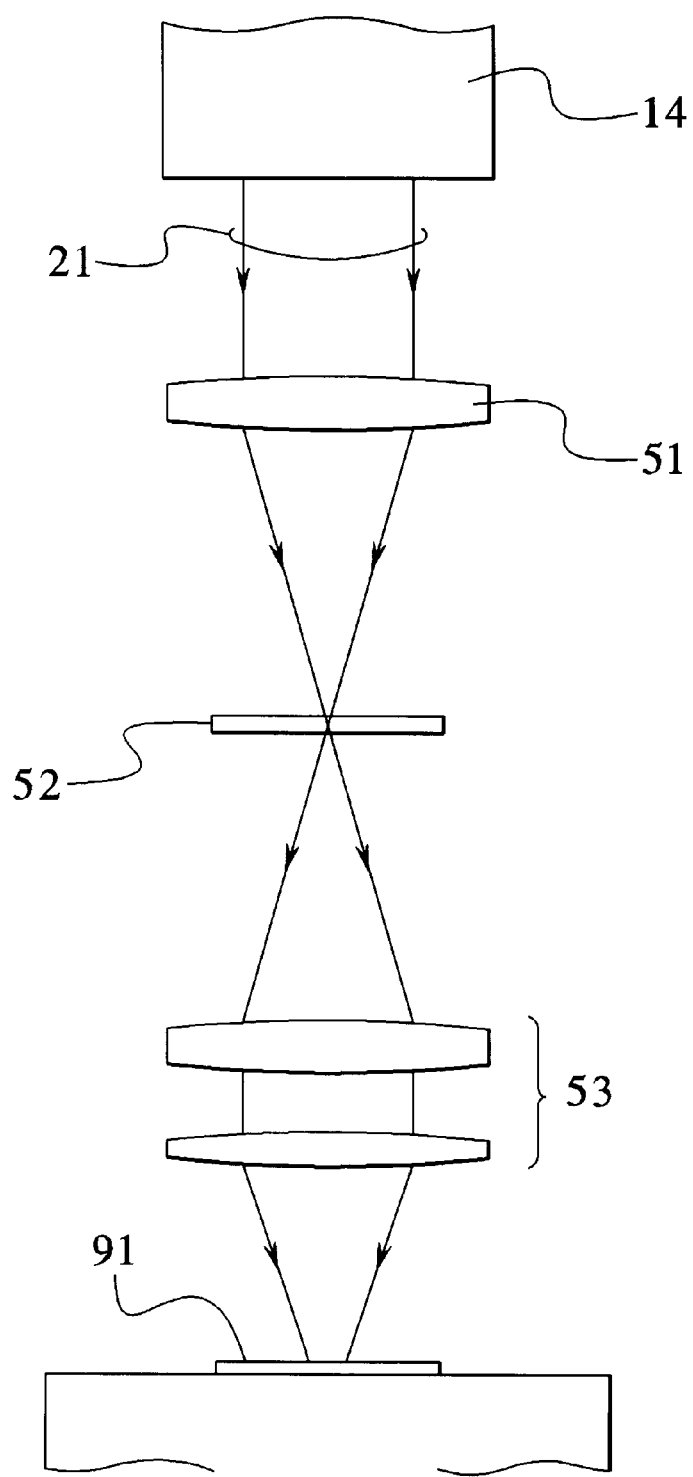
FIG. 4 is a view of the partial configuration of the surface treatment apparatus with a reticle attached.

As shown in FIG. 4, the surface treatment apparatus 1 of the above-mentioned configuration may be provided with a condenser lens 51, a reticle 52, and a projection lens 53 in the optical path of the laser light 21 after passing through the beam homogenizer 14.

Note that the condenser lens 51, the reticle 52, and the projection lens 53 are provided integral with the beam homogenizer 14 and are moved during scanning along with the beam homogenizer 14.

In the configuration, by provision of the reticle 52 in the optical path of the laser light 21 after passing through the beam homogenizer 14, the image of the reticle is projected on the surface of the workpiece 91. Accordingly, laser light 21 is irradiated only at the desired region of the workpiece 91.

Figure 5:
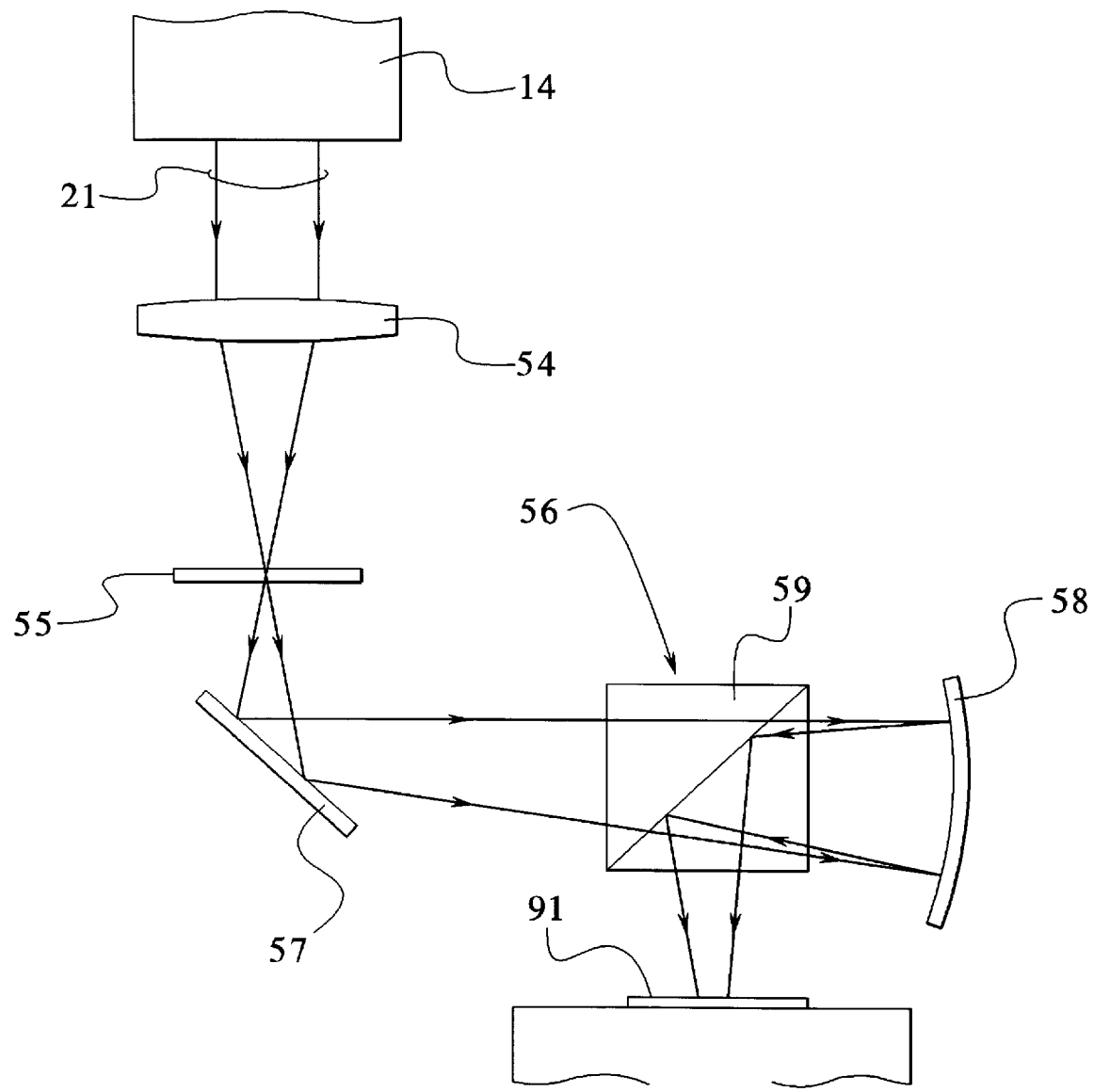
FIG. 5 is a view of the configuration of the surface treatment apparatus with a reticle attached.

As shown in FIG. 5, the surface treatment apparatus 1 of the above-mentioned configuration may be provided with a condenser lens 54, a reticle 55, and a reflection optical system 56 in the optical path of the laser light 21 after passing through the beam homogenizer 14. The reflection optical system 56 is configured as follows. A reflection mirror 57 is provided in the optical path of the laser light 21 after passing through the condenser lens 54 and the reticle 55. A concave reflection mirror 58 is provided in the optical path of the laser light 21 reflected by the reflection mirror 57. Between the reflection mirror 57 and the concave surface reflection mirror 58, there is provided a prism 59 for passing the laser light 21 incident from the reflection mirror 57 side and reflecting the laser light 21 incident from the concave reflection mirror 58.

With the provision of such a reflection optical system 56, the laser light 21 is made to scan the workpiece 91 by movement of the stage 16. Further, the beam homogenizer 14 may be integrally provided with the condenser lens 54, the reticle 55, and the reflection optical system 56 and these moved during scanning along with the beam homogenizer 14.

Since the reticle 55 is provided in the optical path of the laser light 21 after passing through the beam homogenizer 14, the image of the reticle is projected on the surface of the workpiece 91. Therefore, the laser light 21 is irradiated only on the desired region of the workpiece 91. Further, by providing the reflection optical system 56, the chromatic aberration is decreased compared with the case of provision of the condenser lens (54).

Next, an explanation will be made, using the block diagram of FIG. 6, of an alignment means for detecting the target formed on the workpiece 91 and performing positional control. Note that components similar to those explained with reference to the above-mentioned FIG. 3 to FIG. 5 are given the same reference numerals.

Figure 6:
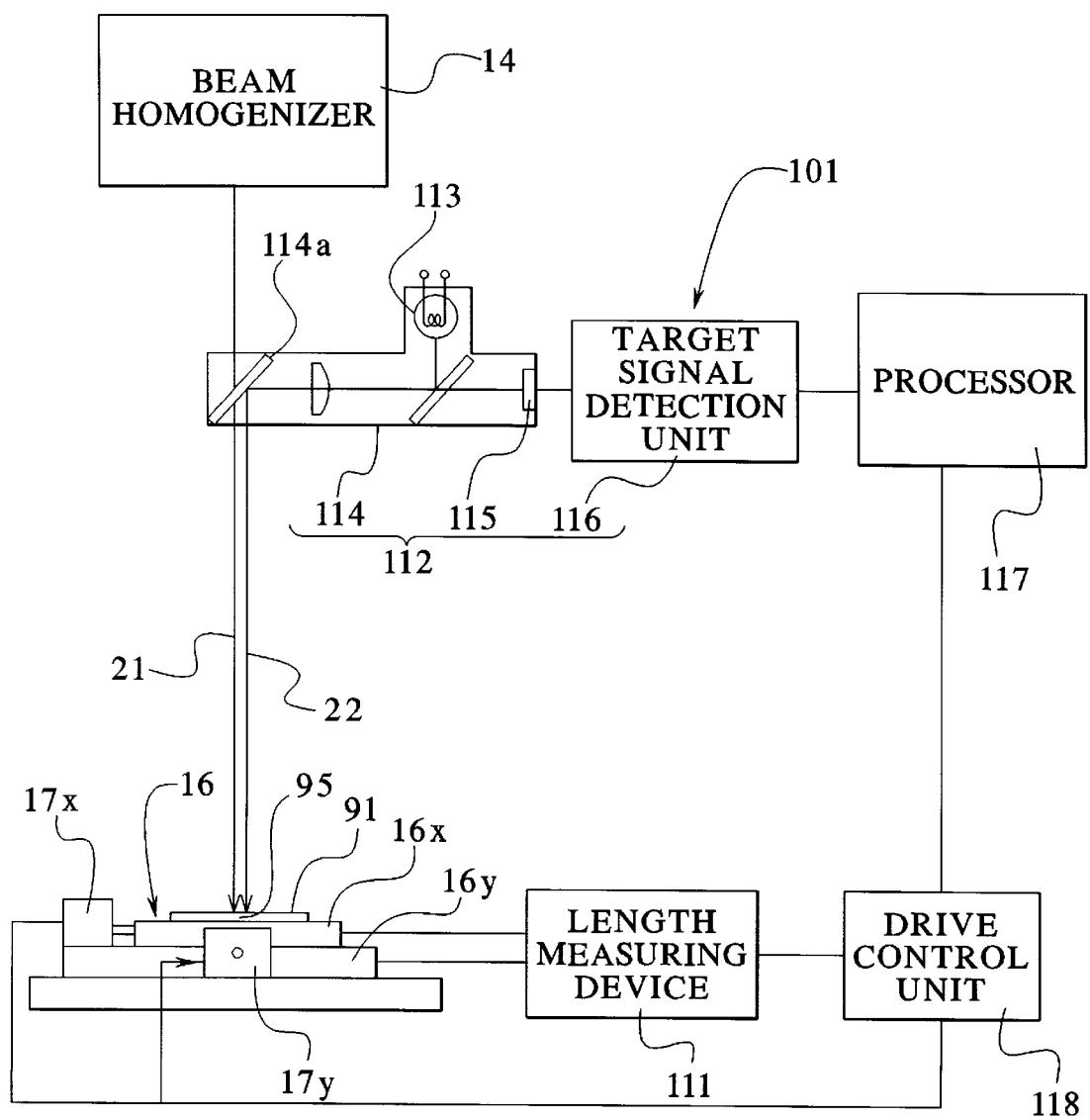
FIG. 6 is a block diagram of a first alignment means in the surface treatment apparatus.

In FIG. 6, the stage 16 is comprised of an x-axis stage 16x, a y-axis stage 16y, an x-axial direction drive unit 17x provided at the x-axis stage 16x, and a y-axial direction drive unit 17y provided at the y-axis stage 16y.

The x-axis stage 16x can move back and forth in the x-axial direction, while the y-axis stage 16y can move back and forth in the y-axial direction orthogonal to the x-axis. Further, the x-axial direction drive unit 17x drives the x-axis stage 16x in the x-axial direction, while the y-axial direction drive unit 17y drives the y-axis stage 16y in the y-axial direction. The x-axial direction drive unit 17x and the y-axial direction drive unit 17y are comprised for example of DC servo motors able to perform step drive.

Further, provision is made of a length measuring device 111 for determining the positions of the x-axis and y-axis stages 16x and 16y. The length measuring device 111 is comprised for example of a length measuring device using helium (He)—neon (Ne) laser light.

Further, provision is made of a target detector 112 for detecting a target 95 of the workpiece 91 placed on the stage 16. The target detector 112 is arranged at a position where the target 95 can be irradiated by the detection light 22, for example, between the beam homogenizer 14 and the workpiece 91. The target detector 112 is for example comprised of a lighting unit 113 for receiving the detection light 22, a detection optical system 114, a photoelectric converter 115, and a target signal detection unit 116.

Note that in the configuration, the laser light 21 irradiated from the beam homogenizer 14 passes through the prism 114a of the detection optical system 114 to be irradiated on the workpiece 91.

The target signal detector 116 of the target detector 112 has connected to it a processor 117. The processor 117 calculates the amount of positional control of the stage 16 by processing of computations based on the target signal received by the target detector 112.

The processor 117 has connected to it a drive control unit 118. The drive control unit 118 receives the signal of the amount of positional control calculated by the processor 117 and further receives the positional information of the stage 16 determined by the length measuring device 111. Further, it calculates the amount of movement of the x-axis and y-axis stages 16x and 16y based on the amount of positional control and the positional information and instructs the amounts of movement to the x-axial direction drive unit 17x and the y-axial direction drive unit 17y.

As explained above, the first alignment means 101 is comprised of the length measuring device 111, the target detector 112, the processor 117, and the drive control unit 118.

Next, an explanation will be made, using the block diagram of FIG. 7, of an alignment means for detecting a target formed on the workpiece 91 and performing positional control of the beam homogenizer 14. Note that components similar to those explained with reference to the FIG. 3 to FIG. 6 are given the same reference numerals.

Figure 7:
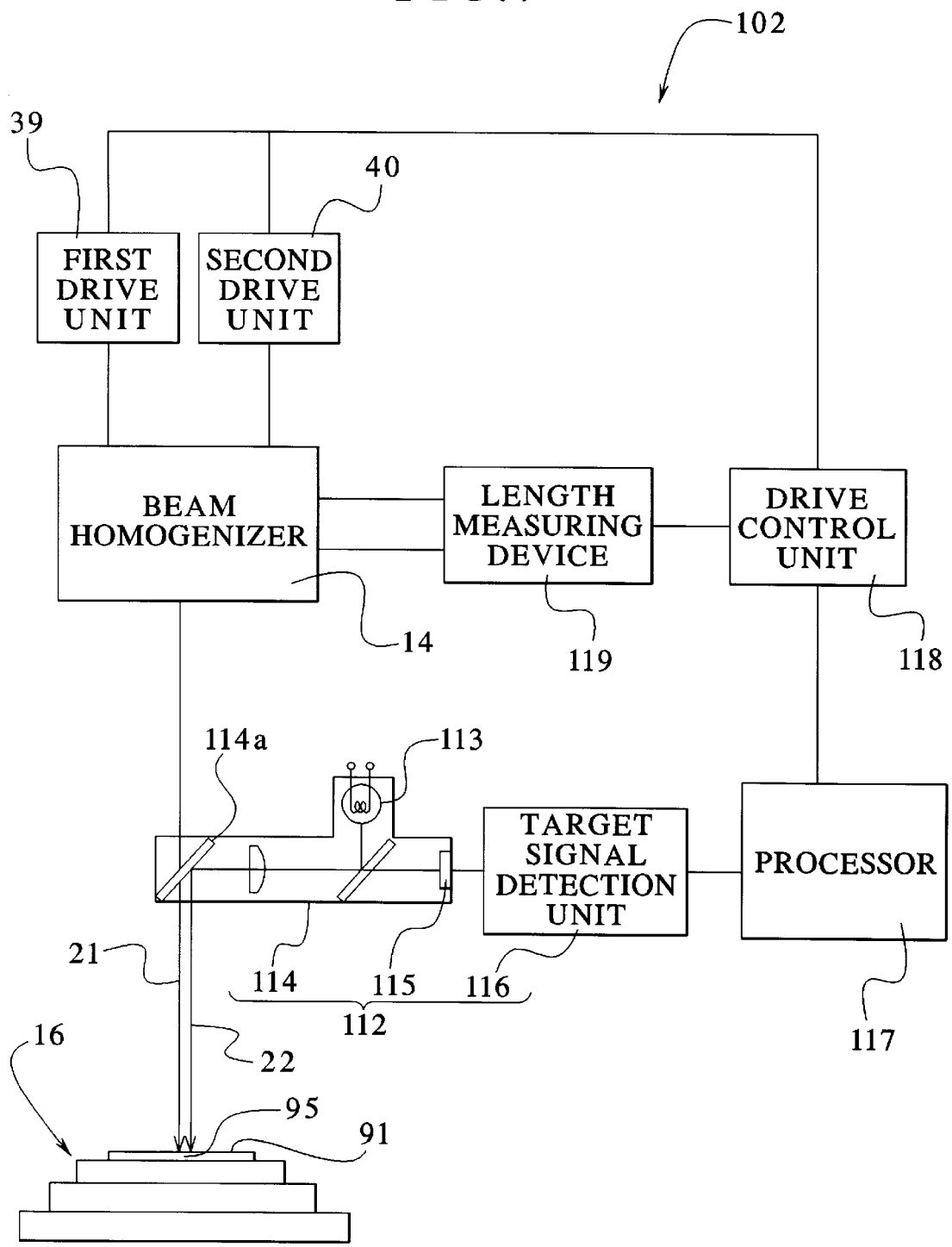
FIG. 7 is a block diagram of a second alignment means in the surface treatment apparatus.

In FIG. 7, provision is made of a length measuring device 119 for determining the position of the beam homogenizer 14 in the x-axial direction and the y-axial direction. The length measuring device 119 is comprised for example of a length measuring device using helium-neon (He—Ne) laser light.

Further, provision is made of a target detector 112 for detecting a target 95 of the workpiece 91 placed on the stage 16. The target detector 112 is arranged at a position where the target 95 can be irradiated by the detection light 22, for example, between the beam homogenizer 14 and the workpiece 91. The target detector 112 has a similar configuration as that explained in the FIG. 6.

Note that in the above-mentioned configuration, the laser light 21 irradiated from the beam homogenizer 14 passes through the prism 114a of the detection optical system 114 to be irradiated on the workpiece 91.

The target signal detector 116 of the target detector 112 has connected to it a processor 117. The processor 117 calculates the amount of positional control of the beam homogenizer 14 by processing of computations based on the target signal received by the target detector 112.

The processor 117 has connected to it a drive control unit 118. The drive control unit 118 receives the signal of the amount of positional control calculated by the processor 117 and further receives the positional information of the beam homogenizer 14 determined by the length measuring device 119. Further, it calculates the amount of movement of the beam homogenizer 14 based on the amount of positional control and the positional information and instructs the amounts of movement to the first and second drive units 39 and 40.

The first and second drive units 39 and 40 are comprised for example of DC servo motors able to perform step drive.

As explained above, the second alignment means 102 is comprised by the length measuring device 119, the target detector 112, the processor 117, and the drive control unit 118.

Note that in the surface treatment apparatus 1 provided with the second alignment means 102, the stage 16 may also be a fixed stage.

It is also possible to provide the first alignment means 101 explained with reference to FIG. 6 and the second alignment means 102 explained with reference to FIG. 7. In this case, for example, the second alignment means 102 performs prealignment at the micron level and for example the first alignment means 101 performs fine alignment at the submicron level.

As mentioned above, since the surface treatment apparatus 1 is provided with the first alignment means 101 and/or the second alignment means 102, positioning at the submicron level becomes possible. As a result, annealing treatment at a submicron order of positioning accuracy can be performed by the step and repeat method.

Further, in the first and second alignment means 101 and 102 explained above, for example it is possible to use an alignment target used in the photosensitizing step of lithographic processes. In this case, there is no need for newly forming a target exclusively for the annealing treatment. Further, by combining a target (not shown) formed on the reticle 52 (55) (see FIG. 4 (FIG. 5)) and the target 95 formed on the workpiece 91, it becomes possible to align the reticle image at the submicron level. As a result, annealing treatment for transferring the reticle image with a submicron order of positioning accuracy can be performed by the step and repeat method.

The alignment means explained above was just one example and may be of any configuration so long as it is provided with a target detector for detecting the target 95 formed on the workpiece 91 and is a control means for driving the stage 16 or a control means for driving the beam homogenizer 14 so that the position of irradiation of the laser light 21 irradiated from the beam homogenizer 14 is made to register with the region of the workpiece 91 for the annealing treatment.

Next, an explanation will be made, with reference to the block diagram of FIG. 8, of an example of the means for adjusting the emission output of the above-mentioned laser device 11.

Figure 8:
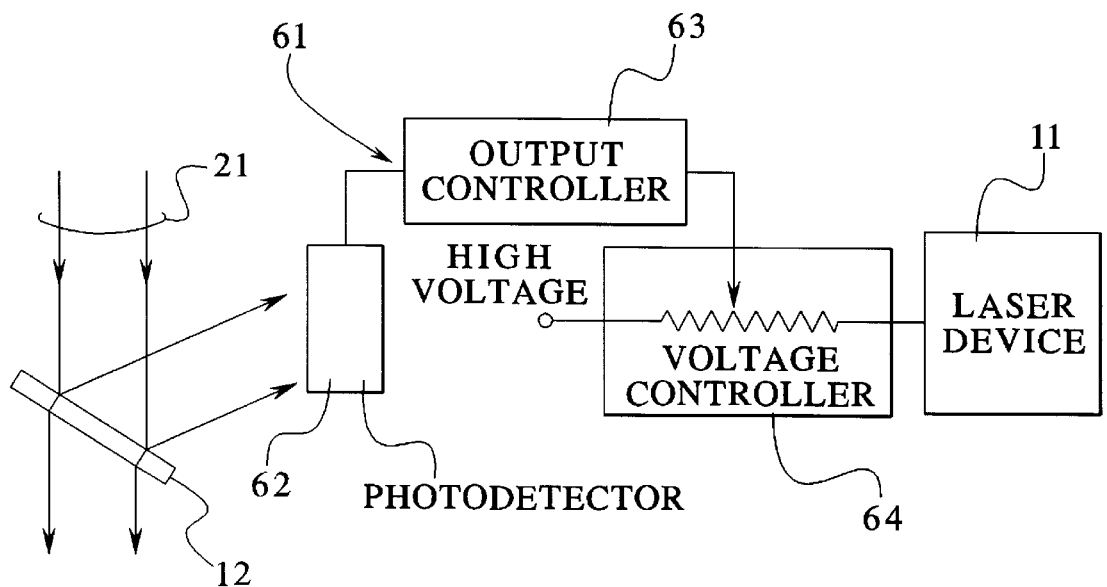
FIG. 8 a block diagram of an adjustment means for adjusting the laser emission output, in the surface treatment apparatus.

In FIG. 8, the surface treatment apparatus 1 is provided with an adjustment means 61 for adjusting the laser emission output. The adjustment means 61 for adjusting the laser emission output is comprised of a photodetector 62, an output controller 63, and a voltage controller 64.

The photodetector 62 detects the intensity of the laser light 21 and is for example comprised of a device for converting the laser light 21 to a current or voltage. For example, it is comprised of a photodiode, a photoelectric electron multiplier tube, or a photocell. Further, for example, it is provided in the optical path of the laser light 21 after reflected by the attenuator 12.

The output controller 63 is connected to the photodetector 62 and instructs an emission voltage value so as to maintain constant the intensity of the laser light 21 emitted from the laser device 11 in accordance with the change in the signal obtained by the photodetector 62.

Further, the voltage adjuster 64 is connected to the output controller 63 and adjusts the high voltage applied to the laser device 11 upon receipt of an instruction from the output controller 63. It is for example comprised of a variable resistor.

In the adjustment means 61 for adjusting the laser emission output, the output controller 63 instructs the intensity of emission of the laser light 21 based on the intensity of the laser light 21 received by the photodetector 62 and, receiving that instruction, the voltage controller 64 adjusts the emission voltage of the laser device 11, so the laser light 21 is emitted by a stable output from the laser device 11.

Figure 9:
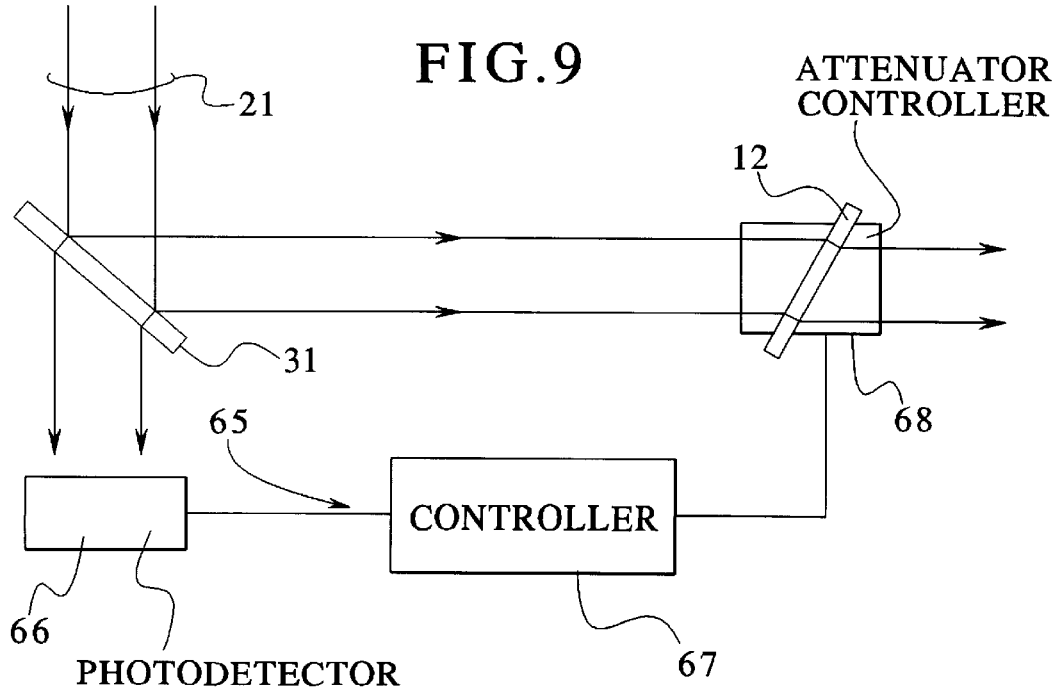
FIG. 9 is a block diagram of another adjustment means for adjusting the laser emission output, in the surface treatment apparatus.

Next, an explanation will be made, with reference to the block diagram of FIG. 9, of another adjustment means 65 for adjusting the emission output of a configuration other than the adjustment means (61) for adjusting the laser emission output of the above configuration.

The means 65 for adjusting the laser emission output is comprised of a photodetector 66, a controller 67, and an attenuator controller 68.

The photodetector 66 is one which detects the intensity of the laser light 21 and is for example comprised of a device which converts the laser light 21 to a current or voltage. For example, it is comprised of a photodiode, a photoelectric electron multiplier tube, or a photocell. Further, for example, the reflection mirror 31 may be formed by a semitransmission mirror and the photodetector 66 may be provided in the optical path of the laser light 21 after passing through this reflection mirror 31. The photodetector 66 is for example comprised of a photodiode which can detect the laser light 21. The controller 67 is connected to the photodetector 66 and instructs the intensity of the laser light 21 in accordance with the change of the signal obtained by the photodetector 66. Further, the attenuator controller 68 adjusts the angle of reception of light of the attenuator 12 with respect to the direction of incidence of the laser light 21 based on the instruction from the controller 67 and is for example comprised of a pulse motor.

With the adjustment means 65 for adjusting the laser emission output, the angle of the attenuator 12 is instructed by the controller 67 based on the intensity of the laser light 21 received by the photodetector 66. Receiving this instruction, the attenuator controller 68 adjusts the angle of reception of light of the attenuator 12 with respect to the direction of incidence of the laser light 21. Accordingly, even if the laser light 21 emitted from the laser device 11 is unstable in output, the laser light 21 after passing through the attenuator 12 is stabilized in output.

Next, three examples of the configuration of the above-mentioned beam homogenizer 14 will be described with reference to FIG. 10 to FIGS. 15A and 15B.

Figure 10:
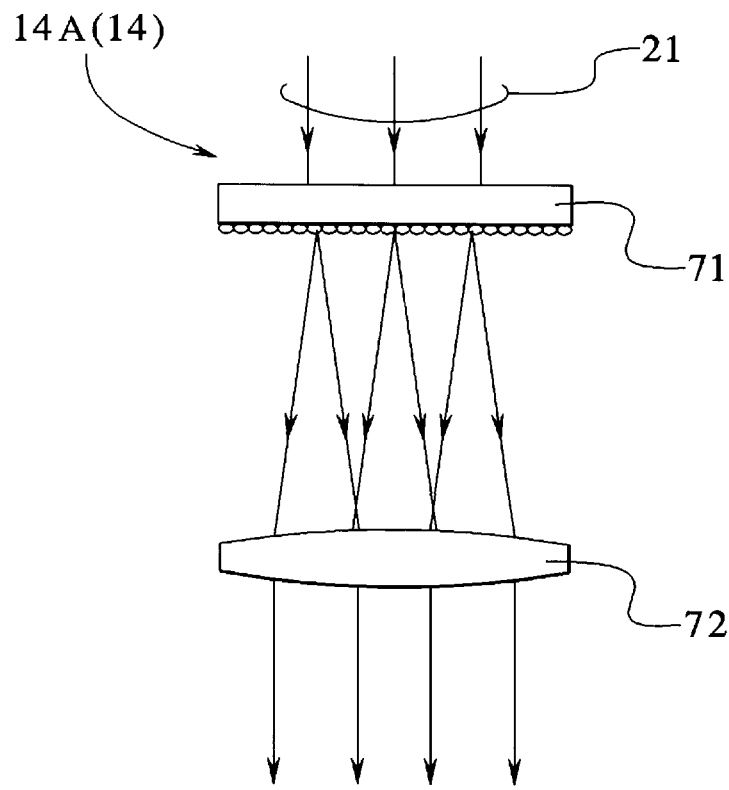
FIG. 10 is a schematic view of the configuration of a beam homogenizer in FIG. 3.
Figure 11:
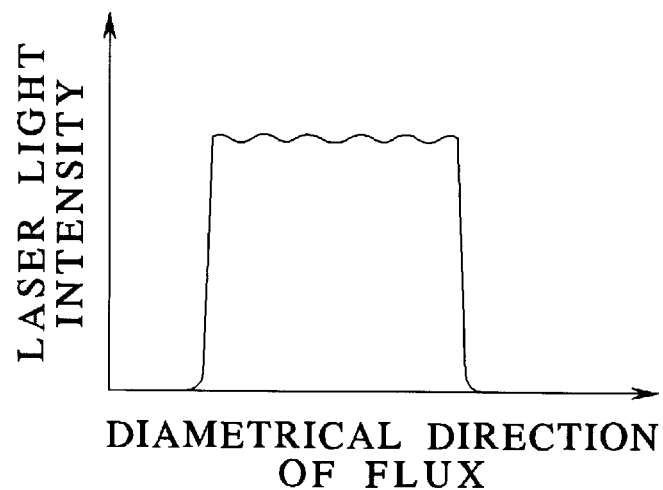
FIG. 11 is a graph showing the distribution of the intensity of the laser light in the diametrical direction of the flux by the beam fomogenizer in FIG. 10.

As shown in FIG. 10, a beam homogenizer 14A (14) as a first example is comprised of a fly's eye lens 71 provided in the optical path of the laser light 21 and a condenser lens 72 provided in the optical path of the laser light 21 after passing through it. With the beam homogenizer 14A, the intensity of the laser light in the diametrical direction of the flux of the laser light 21 is distributed to input substantially uniformly to the condenser lens 71 by the fly's eye lens 71. Further, as shown in FIG. 11, the incident laser light 21 to the condenser lens 72 is made uniform parallel light by the condenser lens 72.

Next, an explanation will be made of a second example of a beam homogenizer with reference to the schematic view of the configuration given in FIG. 12.

Figure 12:
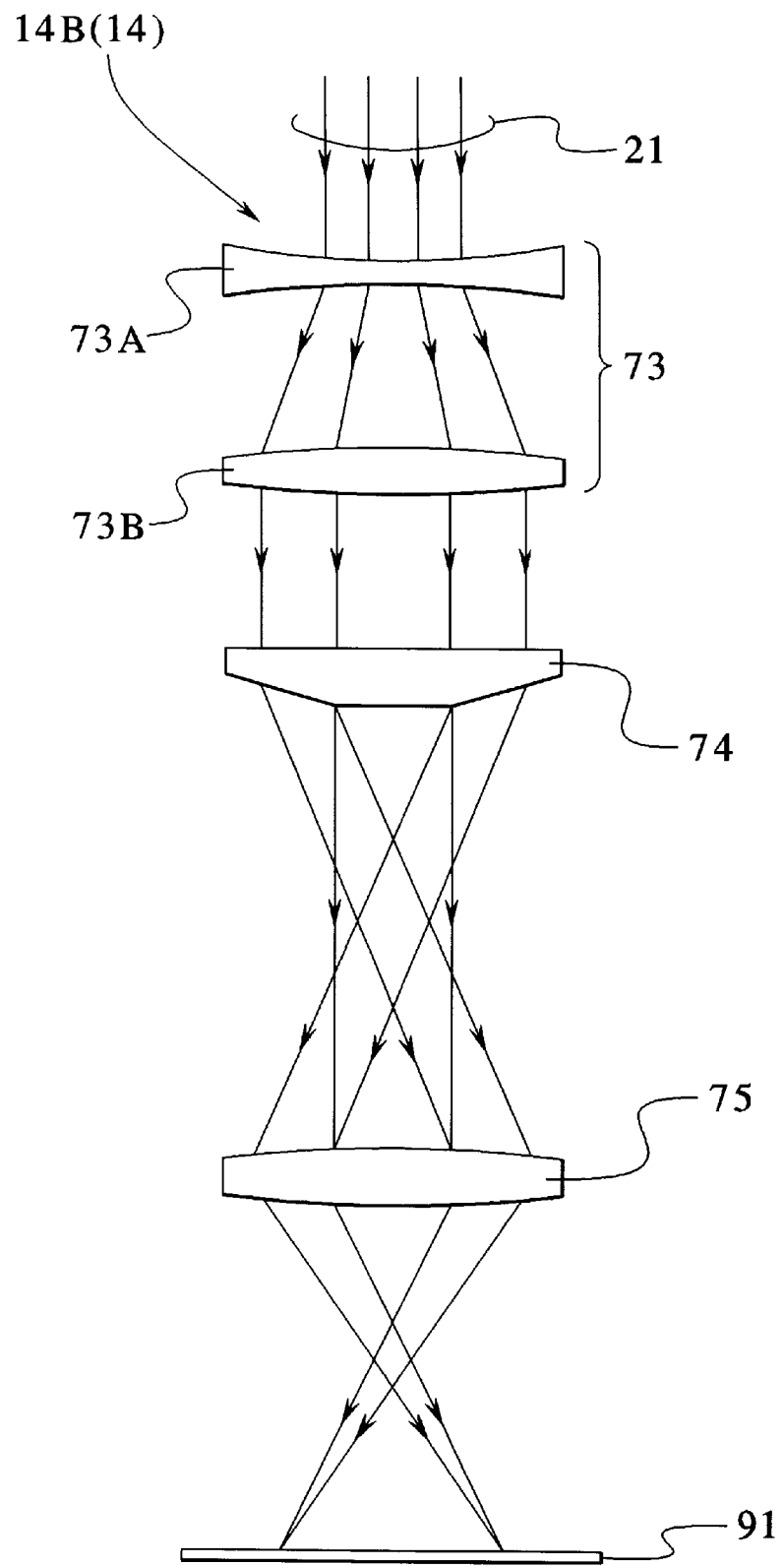
FIG. 12 is a schematic view of the configuration of another beam homogenizer in FIG. 3.

As shown in FIG. 12, a beam homogenizer 14B (14) is comprised of a beam expander 73, a prism 74, and a condenser lens 75 provided in the optical path of the laser light 21. The beam expander 73 is comprised of a lens or a group of lenses of constructions for expanding the diameter of the flux of the laser light 21. For example, it is comprised of a concave cylindrical lens 73A and a convex cylindrical lens 73B. The prism 74 has a center portion formed as a flat plane and an outer peripheral portion formed as an inclined face so as to form part of a conical face. The condenser lens 75 is comprised of a lens of a construction which condenses the laser light 21 split by the prism 74 to form a flux of a substantially uniform light intensity at the surface of the workpiece 91.

Note that the prism 74 may be formed in an annular shape and the face of the annular portion may be given a slant so as to form part of the conical face. In the case of this configuration, a reflection preventing film may be formed at the inside of the annular portion.

Figure 13A:
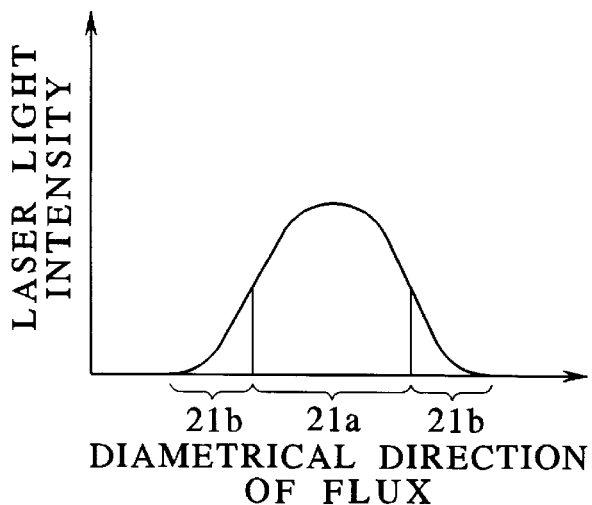
FIGS. 13A to 13C are graphs showing the distributions of the intensity of the laser light in the diametrical direction of the flux by the beam homogenizer in FIG. 12.
Figure 13B:
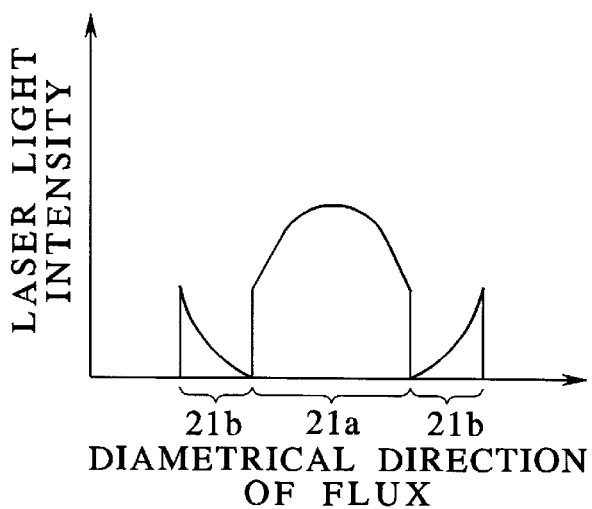
Figure 13C:
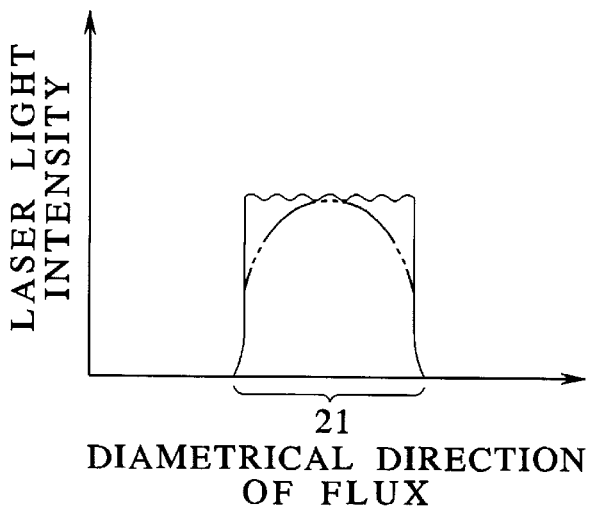

In the beam homogenizer 14B, the diameter of the flux of the laser light 21 is expanded by the beam expander 73. As shown by FIG. 13A, the incident laser light 21 is split by the prism 74 into a center flux 21a (21) and an outer periphery flux 21b (21). Next, as shown in FIG. 13B, the outer periphery flux 21b is inverted at the outer periphery of the center flux 21a and made incident on the condenser lens 75 along with the center flux 21a. Further, as shown in FIG. 13C, the inverted outer periphery flux 21b is superposed on the side periphery of the center flux 21a to form a flux of a uniform energy density (21).

Figure 14:
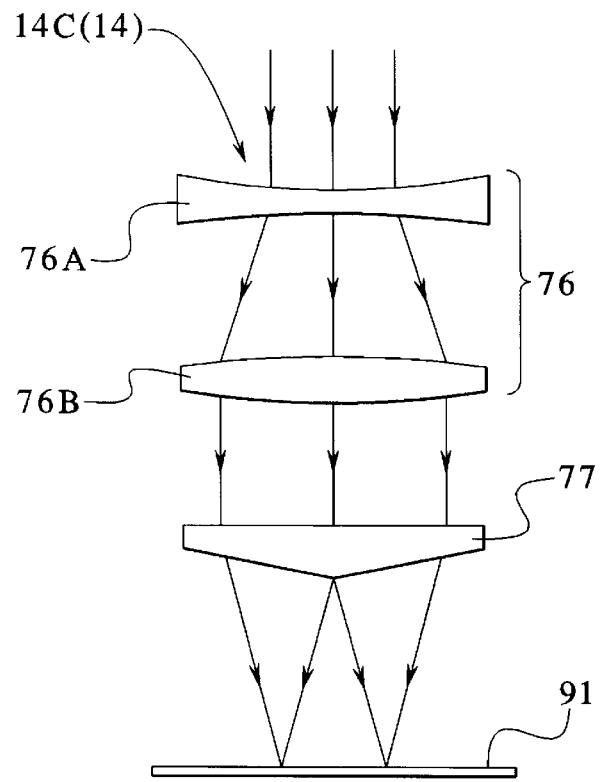
FIG. 14 is a schematic view of the configuration of still another beam homogenizer in FIG. 3.

Next, an explanation will be made of a third example of the beam homogenizer with reference to the schematic configuration shown in FIG. 14.

A beam homogenizer 14C (14) is comprised of a beam expander 76 and prism 77 provided in the optical path of the laser light 21. The beam expander 76 is for example comprised of a concave cylindrical lens 76 A and a convex cylindrical lens 76B. The prism 77 is comprised of a lens with at least one face formed as a convex conical face.

Note that with the beam homogenizer 14 of the above-mentioned configuration, the workpiece 91 is set at a position where the intensity of laser light at the diametrical direction of the flux becomes substantially uniform.

Figure 15A:
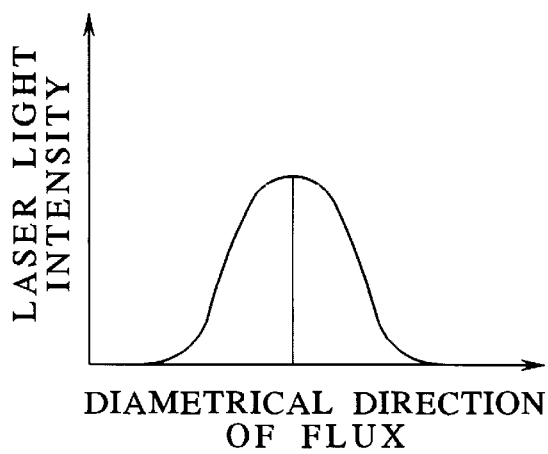
FIGS. 15A and 15B are graphs showing the distributions of the intensity of the laser light in the diametrical direction of the flux, by the beam homogenizer shown in FIG. 14.
Figure 15B:
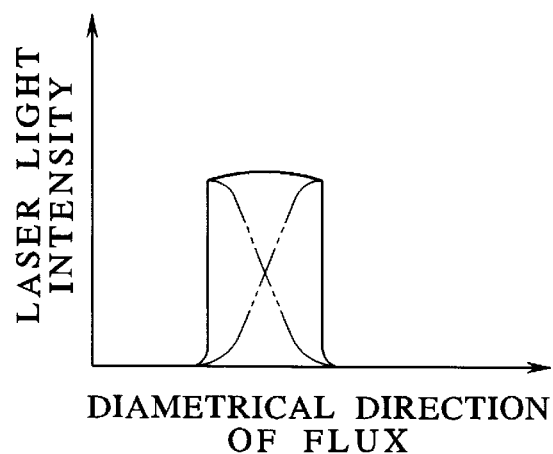

With the beam homogenizer 14C, the diameter of the flux of the laser light 21 is expanded by the beam expander 76. As shown in FIG. 15A, the incident laser light 21 is split by the prism 77 to be symmetrical in the radial direction about the optical axis. Inversion is performed and the results superposed to give, as shown in FIG. 15B, laser light 21 with a substantially uniform intensity of laser light in the diametrical direction of the flux.

Figure 16:
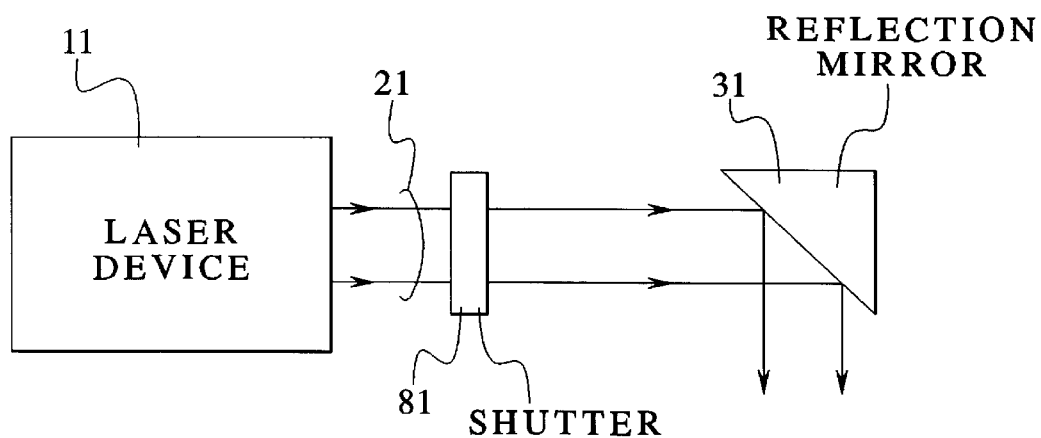
FIG. 16 is a block diagram of the position of installation of a shutter in the surface treatment apparatus.

Next, an explanation will be made of an example of provision of a shutter in the optical path of the laser light 21 in the surface treatment apparatus 1 mentioned above with reference to a block diagram of the position of installation in FIG. 16.

A shutter 81, for example, is provided between the laser device 11 and the reflection mirror 31. The shutter 81 is comprised of a shutter which blocks the laser light 21 and which therefore can temporarily open the optical path of the laser light 21. For example, it is comprised of a focal plane shutter formed of a material which will not undergo any change even if irradiated by laser light 21.

Note that the shutter 81 may be any configuration of shutter so long as it has durability with respect to the laser light 21 irradiated at the time the shutter 81 is closed.

Further, as explained above, the mounting position of the shutter 81 may be in the optical path of the laser light 21 from the reflection mirror 31 to the chamber 15 except between the laser device 11 and the reflection mirror 31.

The shutter 81 blocks the optical path of the laser and temporarily opens the optical path of the laser light 21 in accordance with need, so it is possible to take out a single pulse from the continuously emitted pulses of laser light 21. Accordingly, laser light can be continuously emitted in pulses from the laser device 11 and the output per pulse can be stabilized. The shutter is operated to open and close the optical path in synchronization with the emission of the laser light 21 from the laser device 11 in this state. Due to this, it is possible to take out stably emitted pulses of laser light 21. Further, when the laser light 21 is continuously emitted from the laser device 11, laser light 21 substantially the same as pulse emission can be obtained by opening and closing the shutter 81.

Next, an explanation will be made, with reference to FIGS. 17A and 17B, of the method of annealing treatment using a surface treatment apparatus 1 of the above configuration.

Figure 17A:
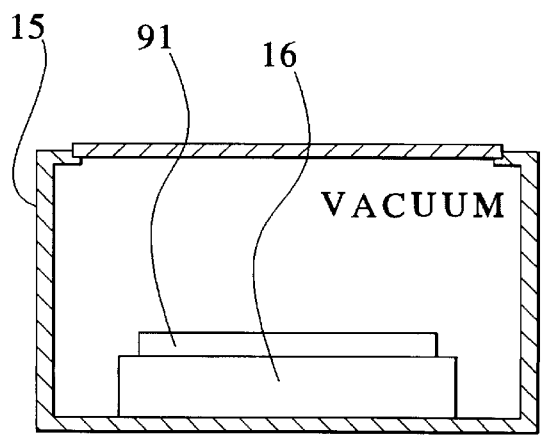
FIGS. 17A and 17B are views explaining annealing treatment.
Figure 17B:
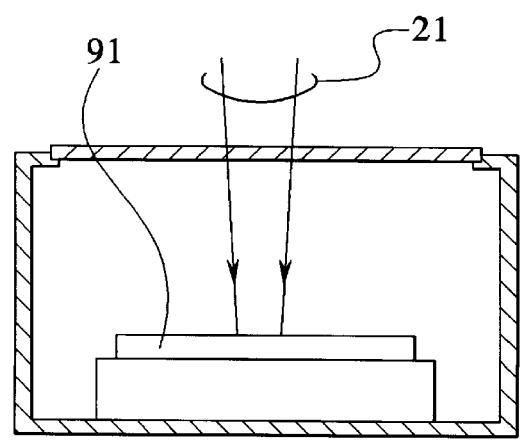

As shown in FIG. 17A, at a first step, the workpiece 91 is placed on the stage 16 provided at the inside of the chamber 15. Next, the atmosphere inside the chamber 15 is for example made a vacuum to establish the annealing treatment atmosphere. Next, as shown in FIG. 17B, the workpiece 91 is irradiated with the laser light 21 to anneal the workpiece 91. At this time, the laser light 21 emitted from the laser device 11 has an energy of about 2 J/pulse or more. Accordingly, even if the intermediate loss up to the irradiation of the workpiece 91 is 30 percent, the surface of the workpiece 91 is irradiated with an energy of 1.4 J/pulse or more.

In annealing treatment for activating a source-drain region of an MOS thin film transistor, for example, an energy density of about 0.3 J/cm$^2$ is required. Accordingly, with laser light 21 of 1.4 J/pulse, it is possible to perform annealing treatment of an area of about 4.6 cm$^2$ (about 2.1 cm×2.1 cm) by irradiation of a single pulse of laser light.

For example, when using the laser device 11 which generates laser light 21 having an energy of about 10 J/pulse, assuming in the same way as above an intermediate loss of 30 percent, it is possible to perform annealing treatment by irradiation of a single pulse of laser light on an area of about 23 cm$^2$ (about 4.8 cm×4.8 cm).

In this way, in the above surface treatment method, it is possible to irradiate a wide area (for example about 1 cm$^2$ or more) by a single shot of laser light 21, so a wide area of the surface of the workpiece 9 is annealed.

Next, an explanation will be made, with reference to FIGS. 18A and 18B, of the method of impurity diffusion treatment using the surface treatment apparatus 1 of the above-mentioned configuration.

Figure 18A:
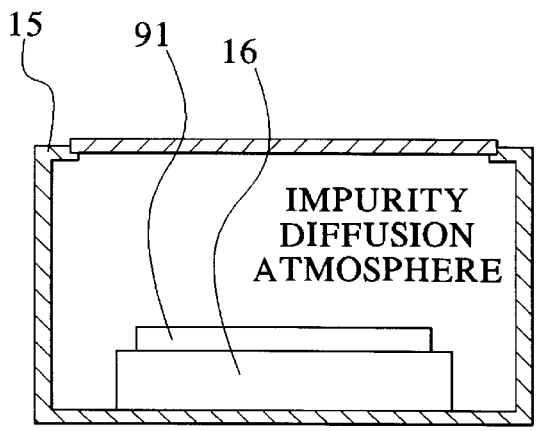
FIGS. 18A and 18B are views explaining diffusion of impurities.
Figure 18B:
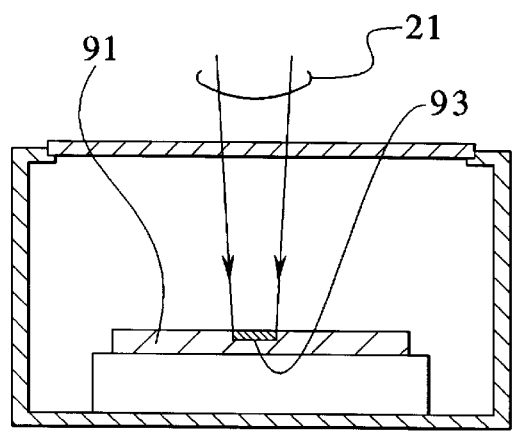

As shown by FIG. 18A, in a first step, the workpiece 91 is placed on the stage 16 provided at the inside of the chamber 15. Next, the inside of the chamber 15 is made an atmosphere for performing the impurity diffusion treatment, e.g., one in which a gaseous mixture of diborane ($B_2H_6$) and argon (Ar) is set to 26.7 Pa. Next, as shown in FIG. 18B, the workpiece 91 is irradiated by laser light 21 to diffuse the impurity in the atmosphere, for example, the boron, in the workpiece 91. This forms the diffusion layer 92. At this time, the laser light 21 emitted from the laser device 11 has an energy of about 2 J/pulse or more. Accordingly, even if the intermediate loss up to the irradiation of the workpiece 91 is 30 percent, the surface of the workpiece 91 is irradiated with an energy of 1.4 J/pulse or more.

When an energy density of about 1.0 J/cm$^2$ is required, it is possible to use laser light 21 of 1.44 J/pulse to perform impurity diffusion treatment on an area of 1.44 cm$^2$ (about 1.2 cm×1.2 cm) by irradiation of a single pulse of laser light.

When using the laser device 11 which emits laser light 21 having an energy of about 10 J/pulse, assuming in the same way as above an intermediate loss of 30 percent, it is possible to perform impurity diffusion treatment by irradiation of a single pulse of laser light on an area of about 14 cm (about 3.7 cm×3.7 cm).

The depth of diffusion (concentration) becomes greater along with the number of pulses.

In such an impurity diffusion treatment method, it becomes possible to irradiate a wide area, for example about 1 cm$^2$ or more, and introduce and diffuse an impurity into the region of the surface of the workpiece 91 irradiated by the laser light 21.

Next, an explanation will be made, with reference to FIGS. 19A and 19B, of the method of oxidation treatment, or nitridization treatment, using the surface treatment apparatus 1 of the above-mentioned configuration.

Figure 19A:
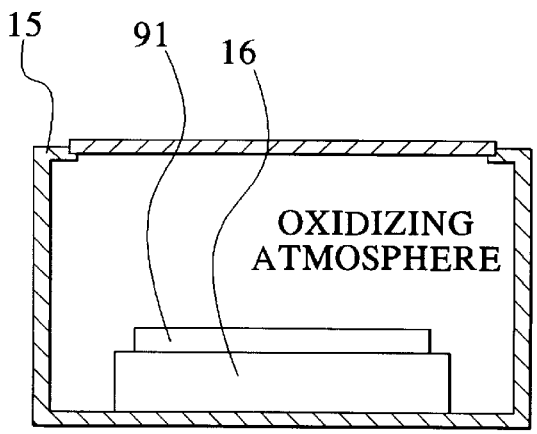
FIGS. 19A and 19B are view explaining oxidation treatment.

In FIG. 19A, at the first step, the workpiece 91 is mounted on the stage 16 provided inside the chamber 15. Next, the inside of the chamber 15 is made an oxidizing atmosphere or nitriding atmosphere. In the case of an oxidizing atmosphere, the atmosphere is made one including oxygen for example. Further, in the case of a nitriding atmosphere, the atmosphere is made one including nitrous oxide ($N_2O$) or ammonia ($NH_3$) for example.

Figure 19B:
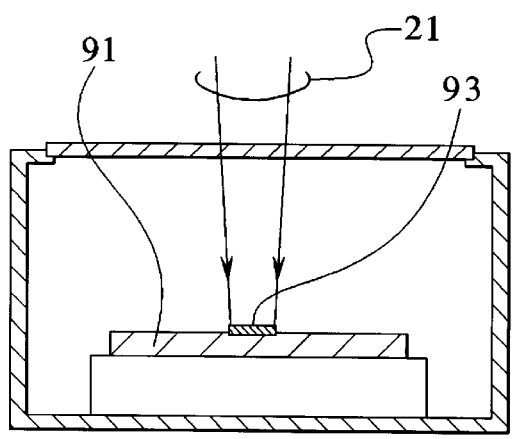

Next, as shown in FIG. 19B, the laser light 21 is irradiated on the workpiece 91 to oxidize (or nitridize) the surface layer of the workpiece 91 with the oxygen (or nitrogen) in the atmosphere and form an oxide layer (or nitride layer) 93.

At this time, the laser light 21 emitted from the laser device 11 has an energy of about 2 J/pulse or more. Accordingly, even if the intermediate loss up to irradiation of the workpiece 91 is 30 percent, the surface of the workpiece 91 is irradiated with an energy of about 1.4 J/pulse or more.

In the oxidation treatment, when for example an energy density of about 1.0 J/cm² is required, an oxide layer 92 may be formed by irradiation of a single pulse of laser light on an area of about 1.44 cm² (about 1.2 cm×1.2 cm) using laser light 21 of 1.4 J/pulse.

When using the laser device 11 which generates the laser light 21 having an energy of about 10 J/pulse, assuming in the same way as above an intermediate loss of 30 percent, an oxide layer 93 may be formed by irradiation of a single pulse of laser light on an area of about 14 cm² (about 3.7 cm×3.7 cm).

Further, it is possible to perform nitridization treatment under conditions substantially the same as the above.

By making the inside of the chamber an oxidizing atmosphere, or nitriding atmosphere, and irradiating laser light on a wide area of the workpiece, an oxide layer or nitride layer may be formed on the surface layer of the region of the workpiece irradiated by the laser light.

In this oxidation or nitridization treatment method, it is possible to irradiate a wide area, for example, one of about 1 cm² or more, with a single shot of the laser light 21, so the region of the workpiece 91 irradiated by the laser light 21 may be oxidized or nitrided.

As explained above, according to the surface treatment apparatus of the present invention, since provision is made of a laser light scanning means, it is possible to scan a desired irradiation position with laser light. Further, since the chamber is provided, it is possible to perform various types of surface treatment by setting the workpiece in a specific atmosphere, for example, a vacuum, oxidizing atmosphere, nitriding atmosphere, atmosphere including a diffusion impurity, etc., and then irradiating it with laser light.

The laser mounted in the above-mentioned surface treatment apparatus has an output of at least 2 J/pulse, so it is possible to perform surface treatment on a wide area, for example, about 1 cm² or more, by irradiation of a single shot of laser light. Further, the energy density of the laser light in the irradiated region can be made substantially uniform.

With the above-mentioned laser light scanning means, the first support supporting the second reflection mirror and the beam homogenizer becomes movable back and forth (reciprocally movement) along the first rail and the second support supporting the first rail and first reflection mirror becomes movable back and forth along the second rail, so the laser light after passing through the beam homogenizer can be used to freely scan in the x-axial and y-axial directions.

With the configuration in which the reticle is provided in the surface treatment apparatus, it is possible to project the image of the reticle on the surface of the workpiece, so it is possible to irradiate laser light on a desired region of the workpiece.

With the configuration in which the alignment means is provided in the surface treatment apparatus, it is possible to position the irradiation position of the laser light to the workpiece at the level of several microns or submicrons. As a result, it becomes possible to perform the annealing treatment while setting the annealing treatment position with a high precision.

With the adjustment means for adjusting the laser emission output provided in the surface treatment apparatus, the voltage applied by the laser is adjusted by the voltage controller based on the intensity of the laser light received by the photodetector, so emission of laser light with a fixed output is possible.

With the another adjustment means for adjusting the laser emission output provided in the surface treatment apparatus, the angle of reception of light of the attenuator is adjusted by the attenuator controller based on the intensity of the laser light received by the photodetector, so it is possible to stabilize the output of the laser light after passing through the attenuator.

With the beam homogenizer provided in the surface treatment apparatus, it is possible to obtain laser light with a substantially uniform laser light intensity in the diametrical direction of the flux of the laser light by the fly's eye lens.

With the beam homogenizer provided with the prism having an annular conical face, the laser light may be split by the prism into a center flux and an outer periphery flux, the outer periphery flux may be inverted and moved to the side periphery of the center flux, and the flux moved to the side periphery may be condensed at the side periphery of the center flux by the condenser lens, so it is possible to obtain laser light with a substantially uniform laser light intensity in the diametrical direction of the condensed flux.

With the beam homogenizer provided with the prism having a convex conical face, the laser light may be split by the prism into a center flux and an outer periphery flux, the outer periphery flux may be inverted and superposed at the side periphery of the center flux, and therefore it is possible to obtain laser light with a substantially uniform laser light intensity in the diametrical direction of the condensed flux.

By provision of a shutter in the surface treatment apparatus, it is possible to cause the continuous emission of pulses of laser light, stabilize the same, and then take out a stabilized pulse. Therefore, it is possible to stabilize the density of irradiated energy of the laser light irradiated on the workpiece.

In the surface treatment method of the present invention, use is made of the surface treatment apparatus, so the laser output per shot is large and it becomes possible to treat the surface of a wide area by a single shot. Further, if use is made of a short wavelength laser light, it becomes possible to anneal only a shallow region of the workpiece. Alternatively, it becomes possible to perform impurity diffusion treatment for diffusing an impurity in a workpiece, an oxidizing treatment for forming an oxide layer, or a nitriding treatment for forming a nitride layer.

FORMATION OF POLYCRYSTALLINE SILICON LAYER

Note, a method of forming a thin layer (thin film) of polycrystalline silicon on a substrate will be described.

First Embodiment

Figure 1:
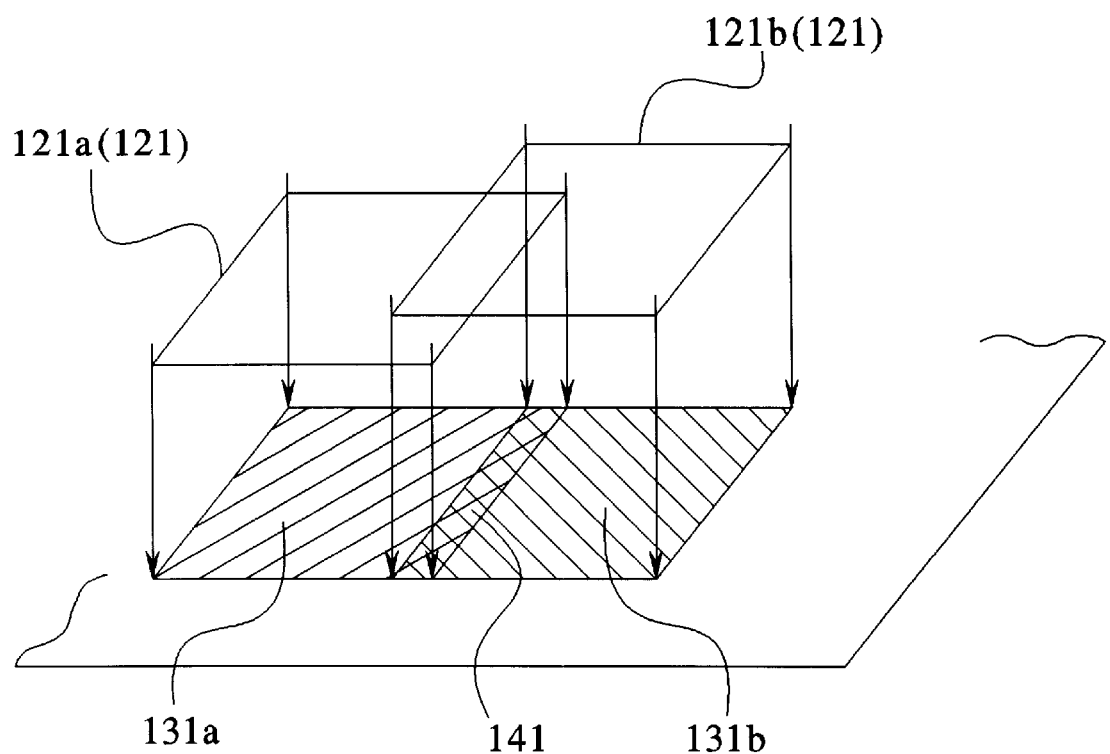
FIG. 1 is an explanatory view of the state of irradiation of a laser light.
Figure 2:
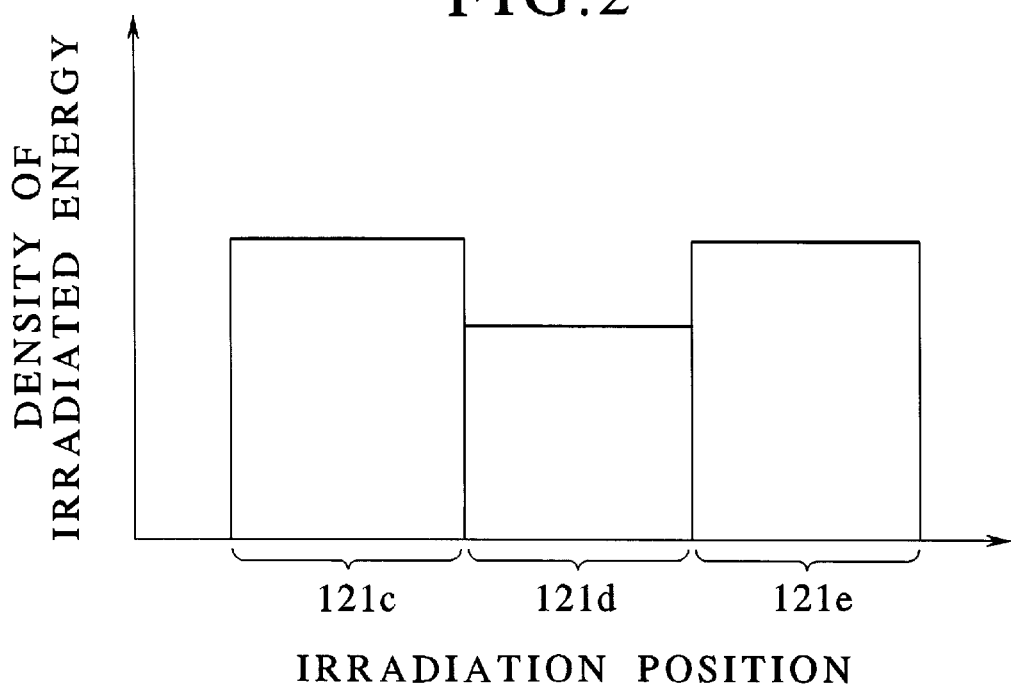
FIG. 2 is a view of the relationship between the density of the irradiated energy and the irradiation position.

A first embodiment of a method of forming a polycrystalline silicon thin film of the present invention will be explained by a process diagram of the formation of a polycrystalline silicon thin film shown in FIG. 1.

Figure 20A:
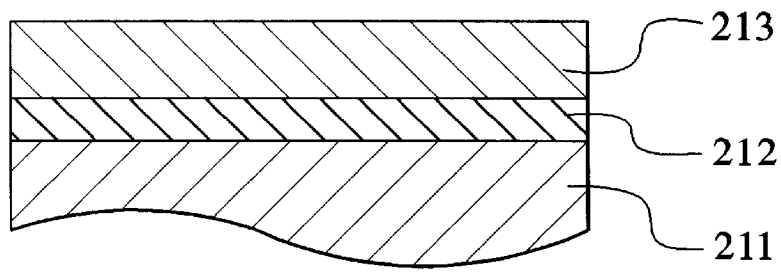
FIGS. 20A and 20B are process diagrams of the method of forming of a polycrystalline silicon thin film according to an embodiment of the present invention.

As shown in FIG. 20A, an insulating layer 212 is formed on the top layer of a substrate 211. The substrate 211 is not particularly limited, but for example use may be made of a silicon substrate or other semiconductor substrate or a glass substrate etc. The insulating layer 212 is not particularly limited, but for example use may be made of silicon oxide. Next, as the first step, for example, use is made of the chemical vapor deposition method to deposit an amorphous silicon layer 213 on the insulating layer 212. This amorphous silicon layer 213 is deposited to a thickness of for example 40 nm.

The amorphous silicon layer 213 is formed for example by the low pressure (LP) CVD method using monosilane (SiH$_4$). As the temperature condition of the deposition, the temperature is preferably set to less than 500° C. for example. By setting the deposition temperature to less than 500° C. in this way, it is possible at the next step to form a polycrystalline silicon thin film with few crystal defects in the grains at the time of annealing the amorphous silicon layer 213 by an excimer laser light emitted from, for example, the surface treatment apparatus mentioned above. Note that when the above-mentioned deposition temperature is set to a temperature higher than 550° C., the crystals partially grow and a polycrystalline silicon thin film with a high defect density is formed.

Next, at least the amorphous silicon layer 213 is heated along with the substrate (substrate heating). This substrate heating is performed using for example a resistance wire. The substrate heating temperature is set to 400° C. for example.

Figure 20B:
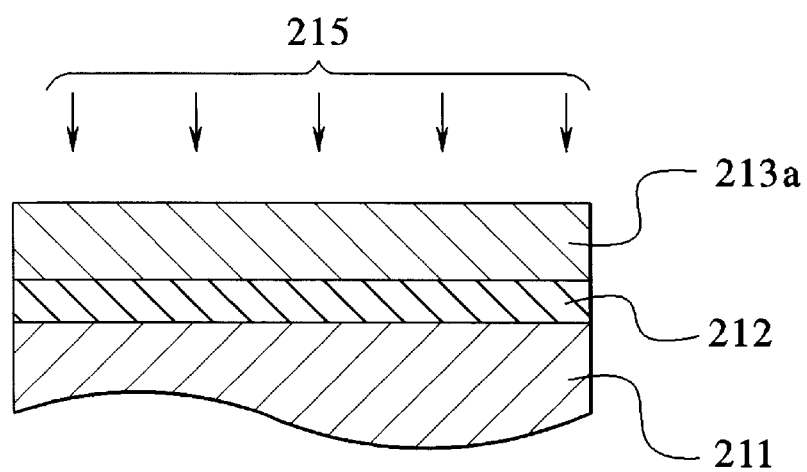

Next, as shown in FIG. 20B, the amorphous silicon layer 213 is irradiated with excimer laser light 15 for direct annealing of the amorphous silicon layer 213. The melted region is recrystallized and a polycrystalline silicon thin film 213a is formed.

As the excimer laser light 215, use is made for example of xenon chloride (XeCl) excimer laser light of a wavelength of 308 nm. In this case, use is made for example of the above-mentioned surface treatment apparatus with a total energy of the excimer laser light 215 of at least 10 J, the excimer laser energy density is set to for example 300 mJ/cm$^2$, and the pulse width is set to for example 150 ns for the irradiation.

Note that the excimer laser light may be any laser light so long as it is of a wavelength which can be easily absorbed by the amorphous silicon layer 213. For example, use may be made of krypton fluoride (KrF) excimer laser light of a wavelength of 249 nm, argon fluoride (ArF) excimer laser light of a wavelength of 193 nm, etc. In this case, the value of the density of the irradiated energy is suitably selected.

In the method of forming a polycrystalline silicon thin film according to this embodiment, by using an excimer laser, provided in the above mentioned surface treatment apparatus, with a total energy of at least 10 J and setting the thickness of the amorphous silicon layer, the substrate heating temperature, the pulse width of the excimer laser light, and the energy density of the excimer laser light to specific values, it is possible to form a polycrystalline silicon thin film 213a with an average grain size of 150 nm and a low electron trap density at the grain boundaries and in the grains over a wide region of at least 6 cm×6 cm (36 cm$^2$). Accordingly, if the obtained polycrystalline silicon thin film is used for a medium or small sized direct-view type liquid crystal display etc., mass production of high performance liquid crystal displays becomes possible.

Second Embodiment

Next, an explanation will be made, using the process diagram of FIG. 21, of the method for depositing a light reflection prevention film 214 on the amorphous silicon layer 213 and irradiating this with excimer laser light 215 as a second embodiment of the method of forming a polycrystalline silicon thin film.

Figure 21:
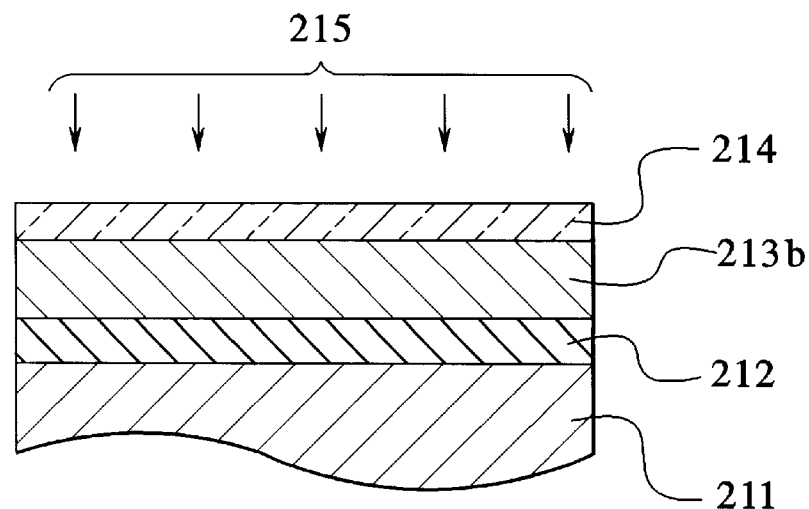
FIG. 21 is a process diagram of the method of forming a polycrystalline silicon thin film according to another embodiment of the present invention.

In the process shown in FIG. 21, the amorphous silicon layer 213 is formed on the surface of the substrate 211 in a similar way to the first embodiment, then a light reflection prevention film 214 is deposited to for example 50 nm on the amorphous silicon layer 213. The conditions for formation of the amorphous silicon layer 13 etc. are similar to those in the first embodiment.

As the light reflection prevention film 214, use may be made of for example silicon oxide (Si$_x$O$_y$), Si$_x$N$_y$, or Si$_x$O$_y$N$_2$. The thickness of the light reflection prevention film 214 is determined so as to give the maximum reflection prevention effect.

In the case of this embodiment, use is made for example of the above-mentioned surface treatment apparatus with a total energy of the excimer laser light 215 of at least 10 J, the energy density is set to for example 200 mJ/cm$^2$, and the pulse width is set to for example 150 ns for the irradiation. Next, an etching technique is used to remove the light reflection prevention film 214. In the method of formation of the polycrystalline silicon thin film according to this second embodiment, by using the light reflection prevention film 214, it is possible to obtain a polycrystalline silicon thin film 213b similar to the polycrystalline silicon thin film 213a obtained in the first embodiment with the excimer laser energy density lower than that in the first embodiment.

If the method of formation of a polycrystalline silicon thin film according to the present invention is used, the polycrystalline silicon thin film 213b with an average grain size of 150 nm and a low electron trap density at the grain boundaries and in the grains can be obtained over a wide region of at least 6 cm×6 cm by a single annealing treatment. Accordingly, if the obtained polycrystalline silicon thin film is used for a medium or small sized direct-view type liquid crystal display etc., mass production of high performance liquid crystal displays becomes possible.

Third Embodiment

Next, an explanation will be made, with reference to the manufacturing process diagram of FIGS. 22A to 22F, of the method of production of a bottom gate type MIS transistor (TFT: thin film transistor) having a channel region formed in the polycrystalline silicon thin film formed using the method of formation of a polycrystalline silicon thin film according to the above-mentioned first embodiment and second embodiment. Note that components similar to those explained with reference to the above-mentioned first embodiment and second embodiment are given the same references and explanations thereof are partially omitted.

Figure 22A:
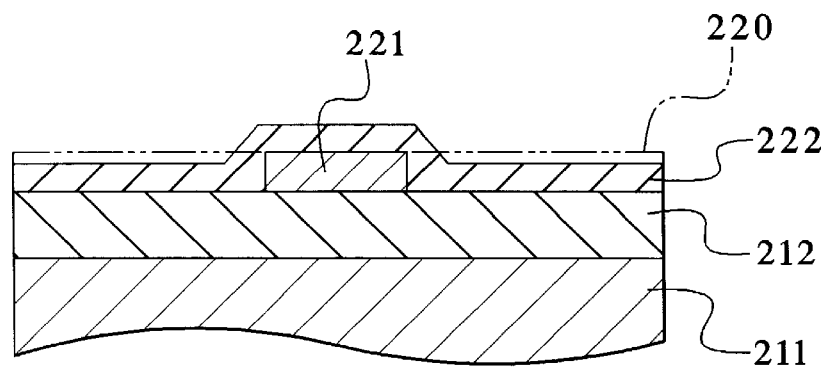
FIGS. 22A to 22F are process diagrams of the method of formation of a channel of an MOS transistor according to an embodiment of the present invention.

First, as shown in FIG. 22A, for example, the chemical vapor deposition method is used to form an insulating layer 212 on the substrate 211. Next, a gate electrode formation film 220 is deposited on the insulating layer 212. The gate electrode formation film 220 is for example formed by the CVD method, is comprised of a polycrystalline or amorphous silicon doped with phosphorus, and for example has a thickness of 100 nm.

Next, a photolithographic technique and etching are used to remove the portion of the gate electrode formation film 220 shown by the two-dot line and to form a gate electrode 221 by the remaining gate electrode formation film 220.

Next, for example, the chemical vapor deposition method (or the heat oxidation method etc.) is used to form a gate insulating film 222 in a state covering at least the surface of the above-mentioned gate electrode 221. The gate insulating film 222 is comprised for example of silicon oxide and has a thickness of for example 30 nm.

Figure 22B:
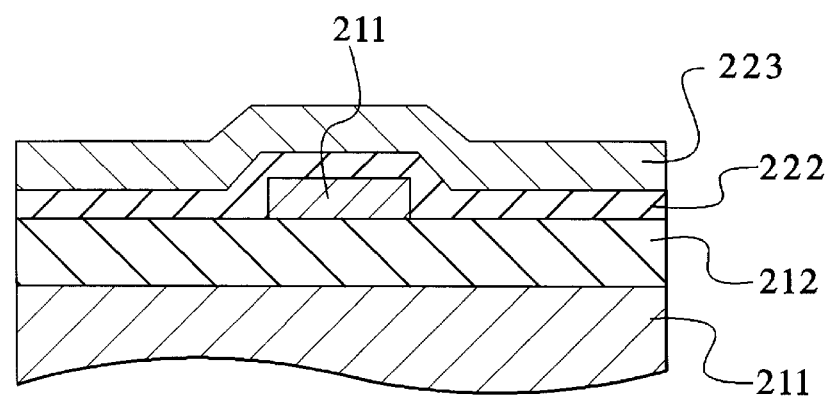

Next, as shown in FIG. 22B, a method similar to the one explained in the above-mentioned first embodiment or second embodiment is used to deposit, by the chemical vapor deposition method, able to form a film superior in step coverage, an amorphous silicon layer 223 on the surface of the gate insulating film 222. This amorphous silicon layer 223 is formed for example to a thickness of 40 nm.

Figure 22C:
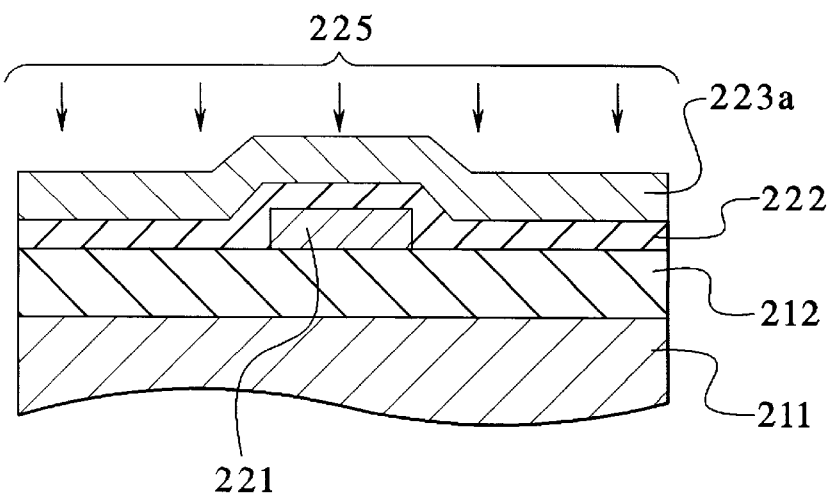

Next, as shown in FIG. 22C, excimer laser light 225 is irradiated on the amorphous silicon layer 223 under conditions similar to the above-mentioned first embodiment or second embodiment to perform direct annealing of the amorphous silicon layer 223. The melted region is recrystallized to form the polycrystalline silicon thin film 223a.

As the excimer laser light 225, use is made for example of xenon chloride (XeCl) excimer laser light of a wavelength of 308 nm. In this case, use is made of the surface treatment apparatus mentioned above of a total energy of the excimer laser light 225 of for example at least 10 J, the excimer laser energy density is set to for example 300 mJ/cm$^2$, and the pulse width is set to for example 150 ns for the irradiation.

Figure 22D:
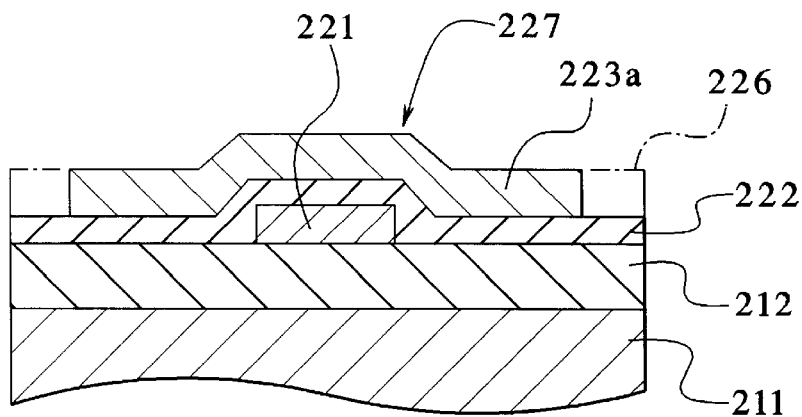

Next, as shown in FIG. 22D, for example, a lithographic technique and etching technique are used to remove the interlayer portion 226 in the polycrystalline silicon thin film 223a shown by the two-dot chain line and form a conductive layer formation region 227 of a predetermined pattern by the polycrystalline silicon thin film 223a on the gate electrode 221 and at the two sides of the same.

Figure 22E:
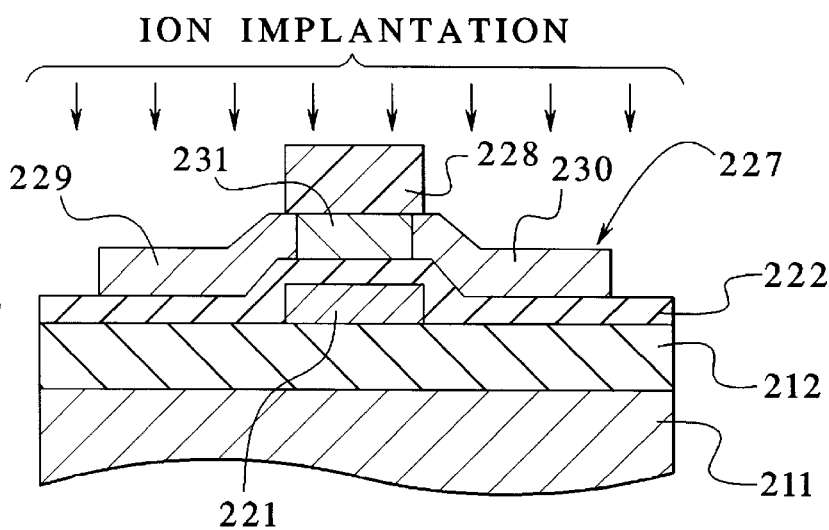

Next, as shown in FIG. 22E, a coating technique and lithographic technique are used to form an ion implantation mask 228 comprised of, for example, a resist film, by the pattern of the gate electrode 221 on the above-mentioned conductive layer formation region 227.

The ion implantation method is then used to introduce an impurity (not shown) into the conductive layer formation region 227 at the two sides of the above-mentioned gate electrode 221 and form the source-drain regions 229 and 230. The conductive layer formation region 227 beneath the ion implantation mask 231 becomes the channel region 231 of the TFT type MOS transistor.

As the ion implantation conditions at this time, for example, the implantation energy is set to 10 KeV, the dosage is set to 3×10$^{15}$cm$^{-2}$, and boron ions (B$^+$) are introduced. Alternatively, the implantation energy is set to 35 KeV, the dosage is set to 3×10$^{15}$ cm$^{-2}$, and borofluoride ions (BF$_2^+$) are introduced.

Next, washer treatment or wet etching etc. is used to remove the ion implantation mask 228.

Annealing for activating the source-drain regions 229 and 230 is then performed. As the annealing conditions, for example, the annealing treatment temperature is set to 900° C. and the annealing treatment time is set to 20 minutes.

Figure 22F:
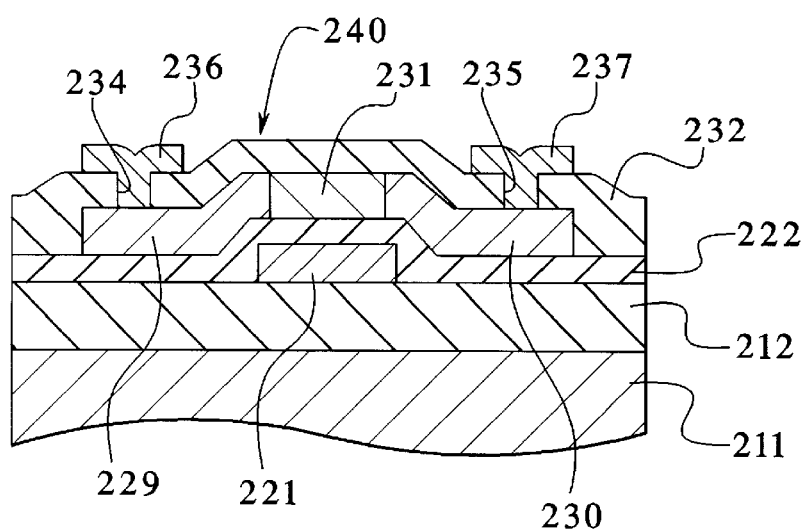

Next, as shown in FIG. 22F, an interlayer insulating film 232 is formed so as to cover the conductive layer formation region 227. The interlayer insulating film 232 is not particularly limited, but for example may be a film formed by the CVD method such as a silicon oxide film, silicon nitride film, PSG (phosphosilicate glass) film, or BPSG (borophosphosilicate glass) film.

Next, the usual photolithographic technique and etching technique are used to form the contact holes 234 and 235 in the interlayer insulating film 232. Further, electrodes 236 and 237 connecting to the source-drain regions 229 and 230 through the contact holes 234 and 235 are formed. Further, while not shown, an electrode connected to the gate electrode 221 is also formed. These electrodes are comprised of polycrystalline silicon or aluminum or another metal. After this, sintering treatment of the electrodes is performed. The conditions for the sintering treatment are not particularly limited, but for example may be 400° C. and one hour.

A bottom gate type of MOS transistor 240 is formed in this way.

In the method for formation of a bottom gate type MOS transistor 240, substantially the same procedure is followed as with the method of formation of a polycrystalline silicon thin film explained with reference to the above-mentioned first embodiment or second embodiment to form the polycrystalline silicon thin film 223a, and the polycrystalline silicon thin film 223a is used as the conductive layer formation region 227. By forming a channel region 231 there, it becomes possible to obtain a channel region 249 with a small electron trap density at the grain boundaries and in the grains. As a result, a TFT type MOS transistor with superior electrical characteristics is obtained.

When the bottom gate construction TFT type MOS transistor 240 according to this embodiment is used for an SRAM load device, for example, the power consumption of the SRAM is reduced. Further, the resistance of the SRAM to software errors is improved, so the reliability is improved. Further, the TFT type MOS transistor according to the present embodiment may be suitably used for a drive transistor of a liquid crystal display as well.

Fourth Embodiment

Next, an explanation will be made, with reference to the manufacturing process diagrams of FIGS. 23A to 23E, of the method of production of a top gate type MOS transistor (TFT) having a channel region formed in the polycrystalline silicon thin film formed using the method of formation of a polycrystalline silicon thin film according to the above-mentioned first embodiment and second embodiment. Note that components similar to those explained with reference to the above-mentioned first embodiment and second embodiment are given the same references and explanations thereof are partially omitted.

Figure 23A:
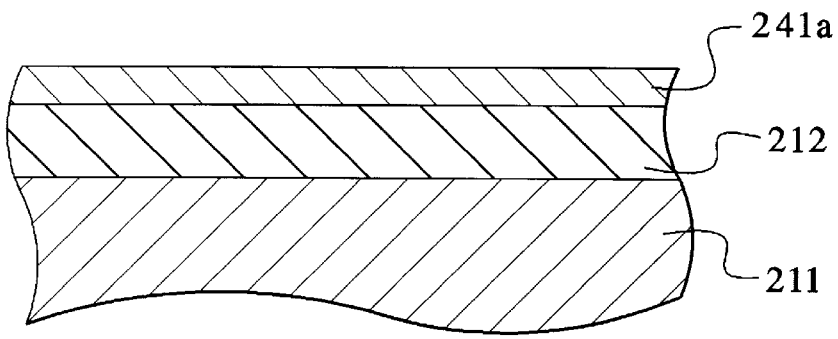
FIGS. 23A to 23E are process diagrams of the method of formation of a channel of an MOS transistor according to another embodiment of the present invention.

First, as shown in FIG. 23A, for example, the chemical vapor deposition method is used to form the insulating layer 212 on the substrate 211. Next, a method similar to the one explained in the above-mentioned first embodiment or second embodiment is used to deposit, by the chemical vapor deposition method, able to form a film superior in step coverage, an amorphous silicon layer 241 on the surface of the insulating layer 212. This amorphous silicon layer 241 is formed for example to a thickness of 40 nm.

Next, the excimer laser light is irradiated on the amorphous silicon layer 241 under conditions similar to the above-mentioned first embodiment or second embodiment to perform direct annealing of the amorphous silicon layer 241. The melted region is recrystallized to form the polycrystalline silicon thin film 241a.

As the excimer laser, use is made for example of xenon chloride (XeCl) excimer laser light of a wavelength of 308 nm. In this case, use is made of the above mentioned surface treatment apparatus of a total energy of the excimer laser light 225 of for example at least 10 J, the excimer laser energy density is set to for example 300 mJ/cm$^2$, and the pulse width is set to for example 150 ns for the irradiation.

Figure 23B:
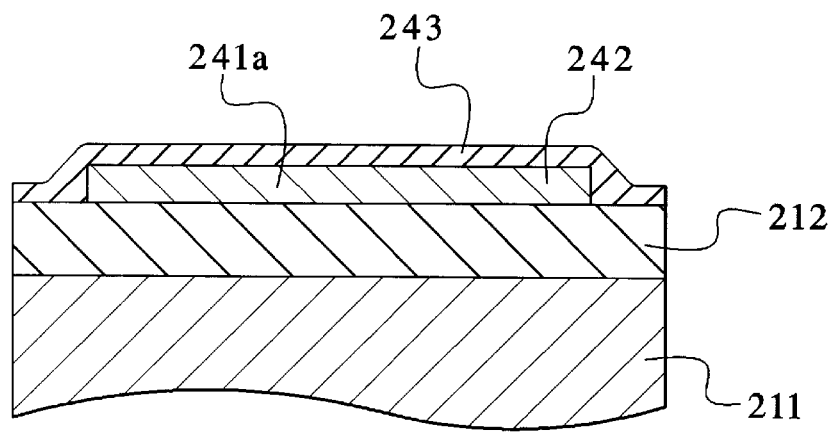

Next, as shown in FIG. 23B, for example, a lithographic technique and etching technique are used to etch the polycrystalline silicon thin film 241a and form a conductive layer formation region 242 of a predetermined pattern.

Next, for example, the chemical vapor deposition method (CVD) or the heat oxidation method etc. is used to form a gate insulating film 243 on the surface of the above-mentioned conductive layer formation region 242. The gate insulating film 242 is comprised for example of silicon oxide and has a thickness of for example 30 nm.

Figure 23C:
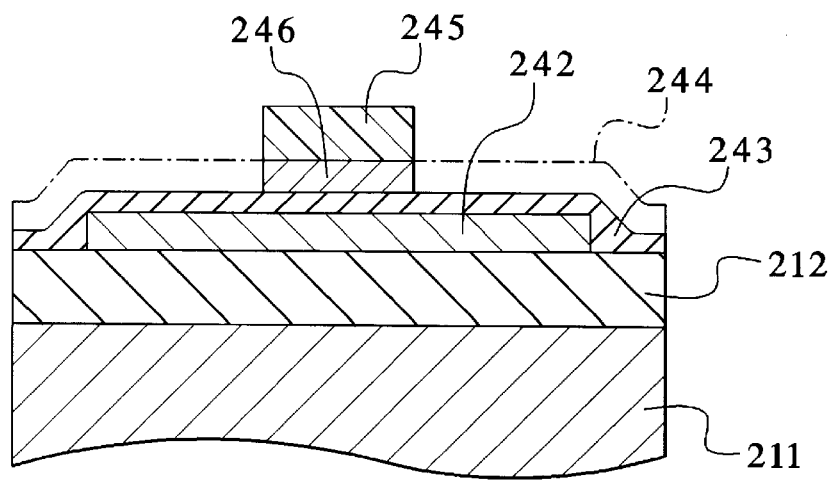

Further, as shown in FIG. 23C, for example, the CVD method is used to deposit a gate electrode formation film 244 on the surface of the above-mentioned gate insulating film 243. The gate electrode formation film 243 is for example comprised of a polycrystalline or amorphous silicon doped with phosphorus, and for example has a thickness of 100 nm.

Next, a lithographic technique using the resist film 245 and an etching technique are used to remove the above-mentioned gate electrode formation film 244 at the portion shown by the two-dot chain line and to form the gate electrode 246 by the gate electrode formation film 244 located on the conductive layer formation region 242.

Figure 23D:
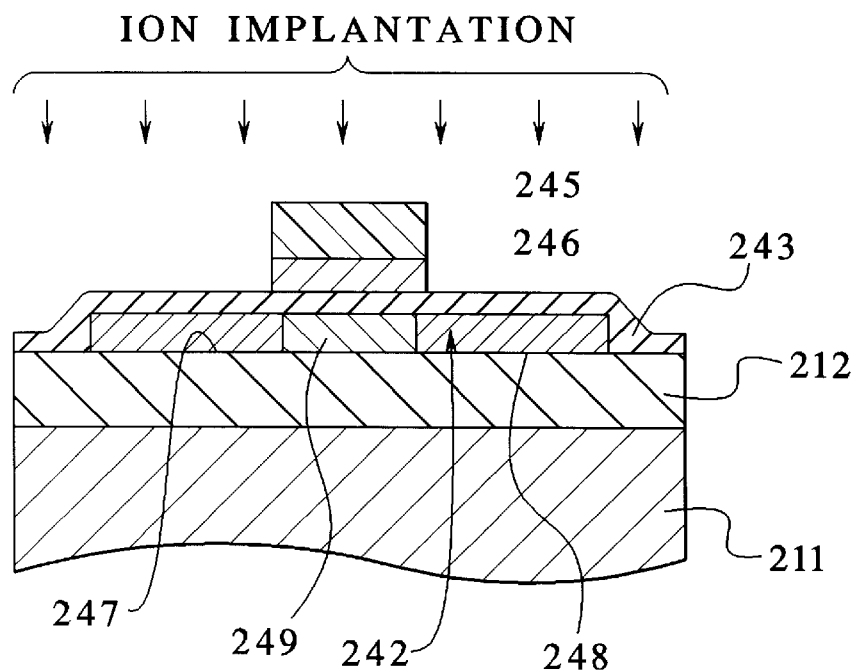

Next, as shown in FIG. 23D, the resist film 245 used at the time of etching for forming the gate electrode 246 is used as an ion implantation mask and ion implantation is performed. Note that for the ion implantation mask, use may also be made of a separate mask from the resist mask 245 of the etching. Due to this ion implantation, an impurity (not shown) is introduced into the above-mentioned conductive layer formation region 242 positioned at the two sides of the gate electrode 246 and the source-drain regions 247 and 248 are formed in a self-aligning manner. Accordingly, a channel region 249 is formed in a self-aligning manner at the conductive layer formation region 242 comprised of the polycrystalline silicon.

As the ion implantation conditions at that time, for example, the implantation energy is set to 10 KeV, the dosage is set to $3 \times 10^{15}$ cm$^{-2}$, and boron ions (B$^+$) are introduced. Alternatively, the implantation energy is set to 35 KeV, the dosage is set to $3 \times 10^{15}$ cm$^{-2}$, and borofluoride ions (BF$_2^+$) are introduced.

Next, washer treatment or wet etching etc. is used to remove the resist film 245.

Annealing for activating the source-drain regions 247 and 248 is then performed. As the annealing conditions, for example, the annealing treatment temperature is set to 900° C. and the annealing treatment time is set to 20 minutes.

Figure 23E:
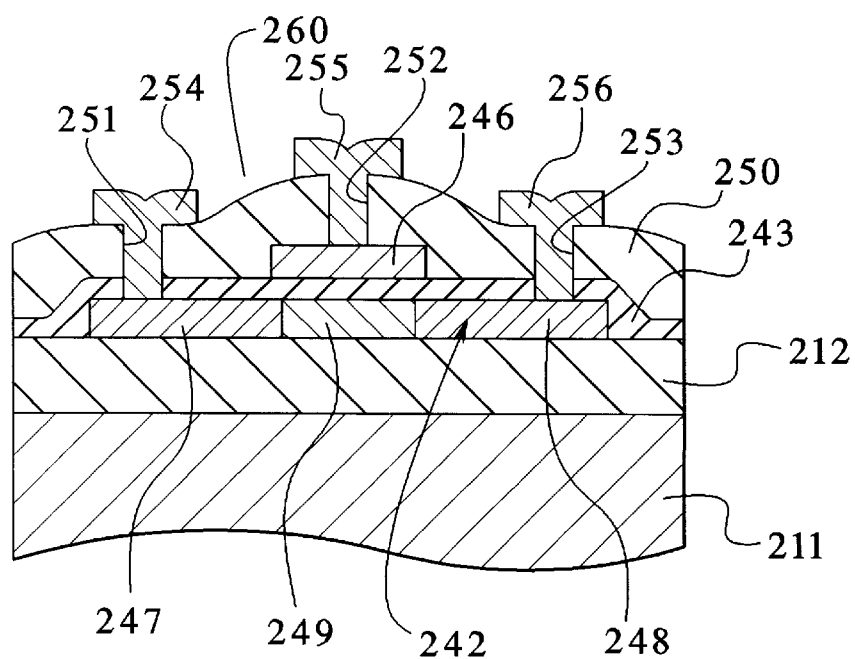

Next, as shown in FIG. 23E, an interlayer insulating film 250 is formed by the CVD method to a thickness of for example 150 nm to 200 nm on the gate electrode 246 and the gate insulating film 243. The interlayer insulating film 250 is formed by a PSG film or BPSG film or other silicon oxide type film or silicon nitride film.

Next, the usual photolithographic technique and etching are used to form the contact holes 251, 252, and 253. Further, the usual interconnection formation techniques are used to form the electrodes 255, 254, and 256 connecting to the gate electrode 246 and the source-drain regions 47 and 48 through the contact holes 251, 252, and 253. The electrodes are comprised of polycrystalline silicon or aluminum or another metal.

After this, sintering is performed. The conditions for the sintering treatment are not particularly limited, but for example may be 400° C. and one hour.

A top gate type of MOS transistor 260 is formed in this way.

In the method for formation of a top gate type MOS transistor 260 according to this embodiment, by using the method of formation of a polycrystalline silicon thin film according to the above-mentioned first embodiment or second embodiment to form the polycrystalline silicon thin film 41a and by forming a channel region 249 in the polycrystalline silicon thin film 241a, it becomes possible to obtain a channel region 249 with a small electron trap density at the grain boundaries and in the grains. As a result, a TFT type MOS transistor with superior electrical characteristics is obtained.

When the top gate construction TFT type MOS transistor 260 according to this embodiment is used for an SRAM load device, for example, the power consumption of the SRAM is reduced. Further, the resistance of the SRAM to software errors is improved, so the reliability is improved. Further, the TFT type MOS transistor according to the present embodiment may be suitably used for a drive transistor of a liquid crystal display as well.

The present invention will be explained below with reference to more detailed examples. Note that the present invention is not limited to these examples.

EXAMPLE 1

First, an amorphous silicon film of a thickness of 80 nm was formed on a quartz substrate by the low pressure (LP) CVD method using monosilane (SiH$_4$). The deposition temperature was 500° C. Next, the excimer laser light was irradiated on the amorphous silicon film to crystallize the amorphous silicon and obtain a polycrystalline silicon film. At that time, the substrate was heated to 400° C. The surface treatment apparatus used for the laser irradiation was a VEL of Sopra Co. with a total energy of 10 J. The energy density of the laser was 280 mJ/cm$^2$. The number of shots was one and the range covered was 6 cm×6 cm.

Figure 24:
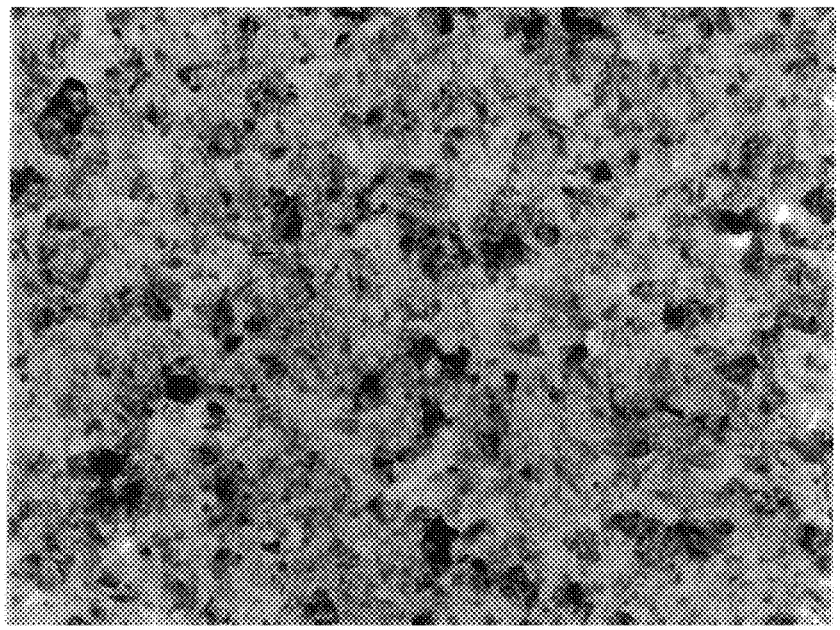
FIG. 24 is a view of an electron micrograph showing the results of TEM observation (bright-field image) of a polycrystalline silicon film according to Example 1 of the present invention.

Next, for observation by a transmission type electron microscope (TEM), the quartz substrate (SiO$_2$) was etched using a liquid mixture of HF:H$_2$O=1:1 to obtain just the polycrystalline silicon thin film (sample). The results of the TEM observation (bright-field image) at the substantial center portion of the sample are shown in FIG. 24. As the TEM, use was made of a JEOL 2000FX-II of an acceleration voltage of 200 kV.

Table 1 shows the results when finding the range of the grain size and average grain size in the polycrystalline silicon film (sample) from the photograph shown in FIG. 24.

TABLE 1

Dependency of Polycrystalline Silicon Grain Size on
Excimer Laser Energy Density in Case of Thickness of 80
nm, Substrate Heating of 400° C., and Single Shot

|  | Comp. Ex. 1 | Ex. 1 | Ex. 2 |
|---|---|---|---|
| Excimer laser energy energy density (mJ/cm$^2$) | 220 | 280 | 350 |
| Grain size range (nm) | (Amo.) | 20–60 | 20–100 |
| Average grain size (nm) | (Amo.) | 25 | 60 |

EXAMPLE 2

The same procedure was followed as in Example 1 to prepare a sample except that the laser energy density was made 350 mJ/cm$^2$. TEM observation was performed at the substantial center portion of the sample. The results of the TEM observation (bright-field image) are shown in FIG. 25.

Figure 25:
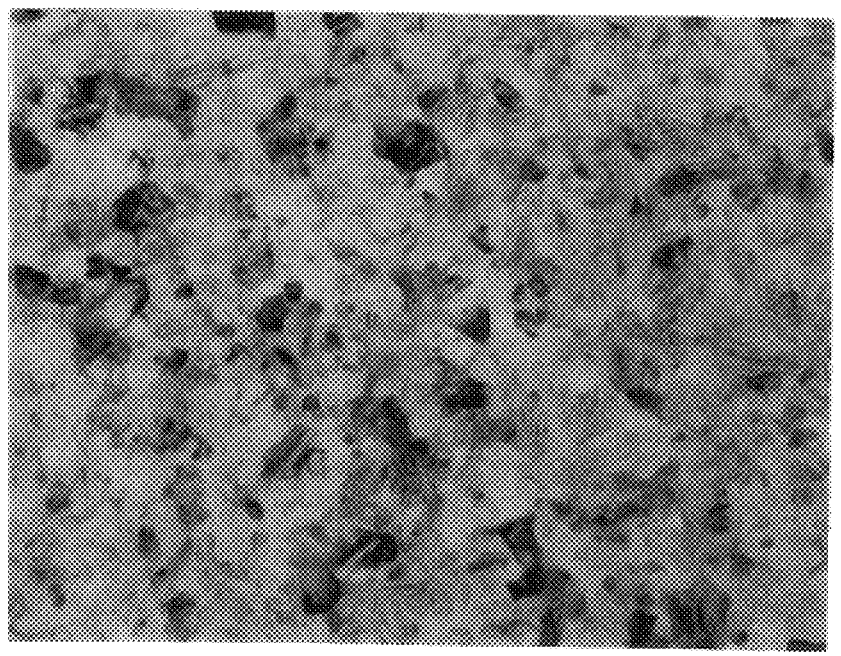
FIG. 25 is a view of an electron micrograph showing the results of TEM observation (bright-field image) of a polycrystalline silicon film according to Example 2 of the present invention.

Table 1 shows the results when finding the range of the grain size and average grain size in the polycrystalline silicon film (sample) from the photograph shown in FIG. 25.

COMPARATIVE EXAMPLE 1

The same procedure was followed as in Example 1 to prepare a sample except that the laser energy density was made 220 mJ/cm$^2$. TEM observation was performed at the substantial center portion of the sample. The results of the TEM observation (electron diffractograph) are shown in FIG. 26.

Figure 26:
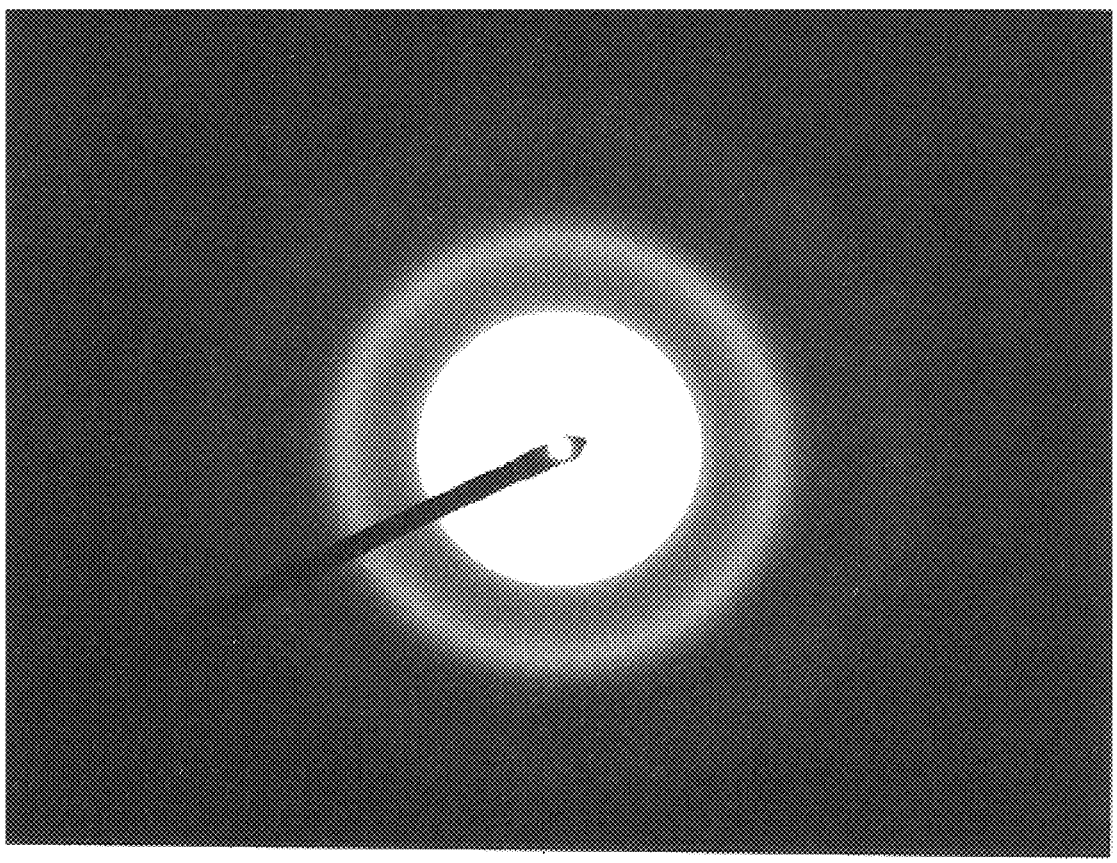
FIG. 26 is a view of an electron micrograph of the results of TEM observation (electron diffractograph) of a sample according to Comparative Example 1 of the present invention.

The diffractograph of the photograph shown in FIG. 26 shows that the sample remains amorphous.

Evaluation

Comparing Examples 1 and 2 and Comparative Example 1, it was found that, as shown in the above-mentioned Table 1, at a thickness of 80 nm, Example 2, where the energy density was 350 mJ/cm$^2$, is preferable for obtaining a polycrystalline silicon thin film with a large grain size.

EXAMPLE 3

The same procedure was followed as in Example 1 to prepare a sample except that the thickness of the amorphous silicon film at the time deposition was made 40 nm and the laser energy density was made 300 mJ/cm$^2$. TEM observation was performed at the substantial center portion of the sample. The results of the TEM observation (bright-field image) are shown in FIG. 25.

Figure 27:
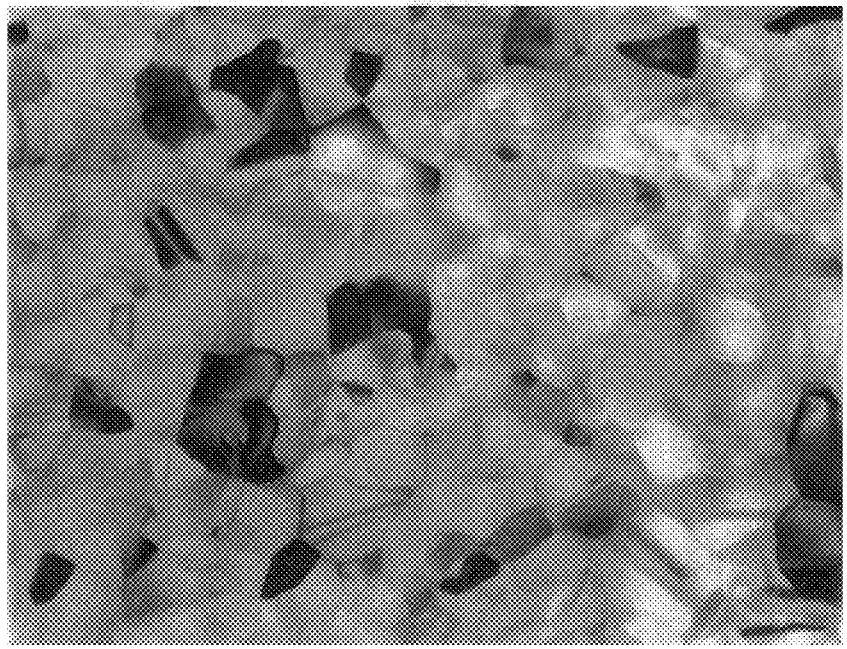
FIG. 27 is a view of an electron micrograph showing the results of TEM observation (bright-field image) of a polycrystalline silicon film according to Example 3 of the present invention.

Table 2 shows the results when finding the range of the grain size and average grain size in the polycrystalline silicon film (sample) from the photograph shown in FIG. 27.

TABLE 2

Dependency of Polycrystalline Silicon Grain Size on Excimer Laser Energy Density in Case of Thickness of 40 nm, Substrate Heating of 400° C., and Single Shot

|  | Comp. Ex. 2 | Ex. 3 | Ex. 4 |
| --- | --- | --- | --- |
| Excimer laser energy density (mJ/cm$^2$) | 150 | 300 | 350 |
| Grain size range (nm) | (Amo.) | 50–200 | 50–200 |
| Average grain size (nm) | (Amo.) | 150 | 150 |

EXAMPLE 4

The same procedure was followed as in Example 1 to prepare a sample except that the thickness of the amorphous silicon film at the time deposition was made 40 nm and the laser energy density was made 350 mJ/cm$^2$. TEM observation was performed at the substantial center portion of the sample. The results of the TEM observation (bright-field image) are shown in FIG. 25.

Figure 28:
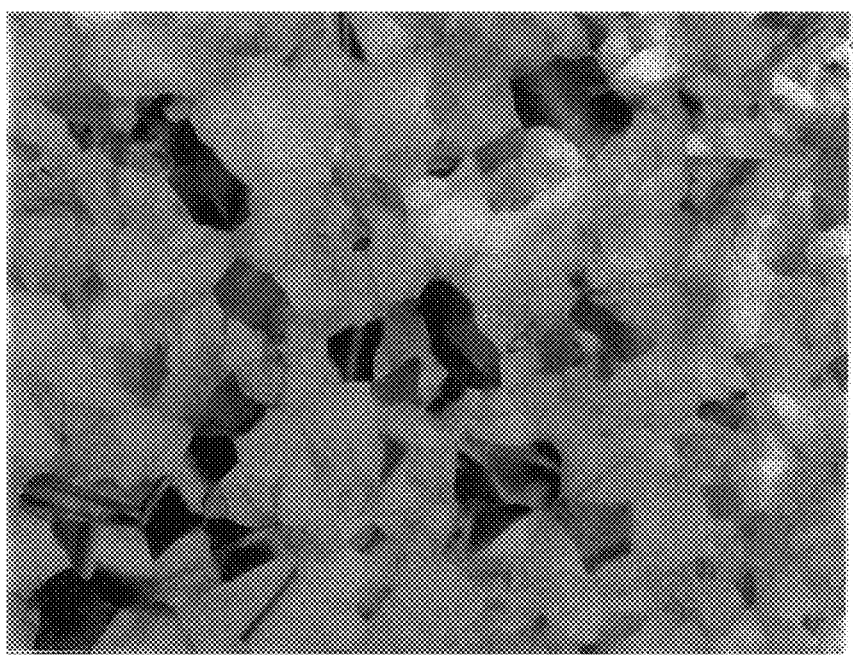
FIG. 28 is an electron micrograph showing the results of TEM observation (bright-field image) of a polycrystalline silicon film according to Example 4 of the present invention.

Table 2 shows the results when finding the range of the grain size and average grain size in the polycrystalline silicon film (sample) from the photograph shown in FIG. 28.

COMPARATIVE EXAMPLE 2

The same procedure was followed as in Example 1 to prepare a sample except that the thickness of the amorphous silicon film at the time deposition was made 40 nm and the laser energy density was made 150 mJ/cm$^2$. TEM observation was performed at the substantial center portion of the sample. The results of the TEM observation (electron diffractograph) are shown in FIG. 29.

Figure 29:
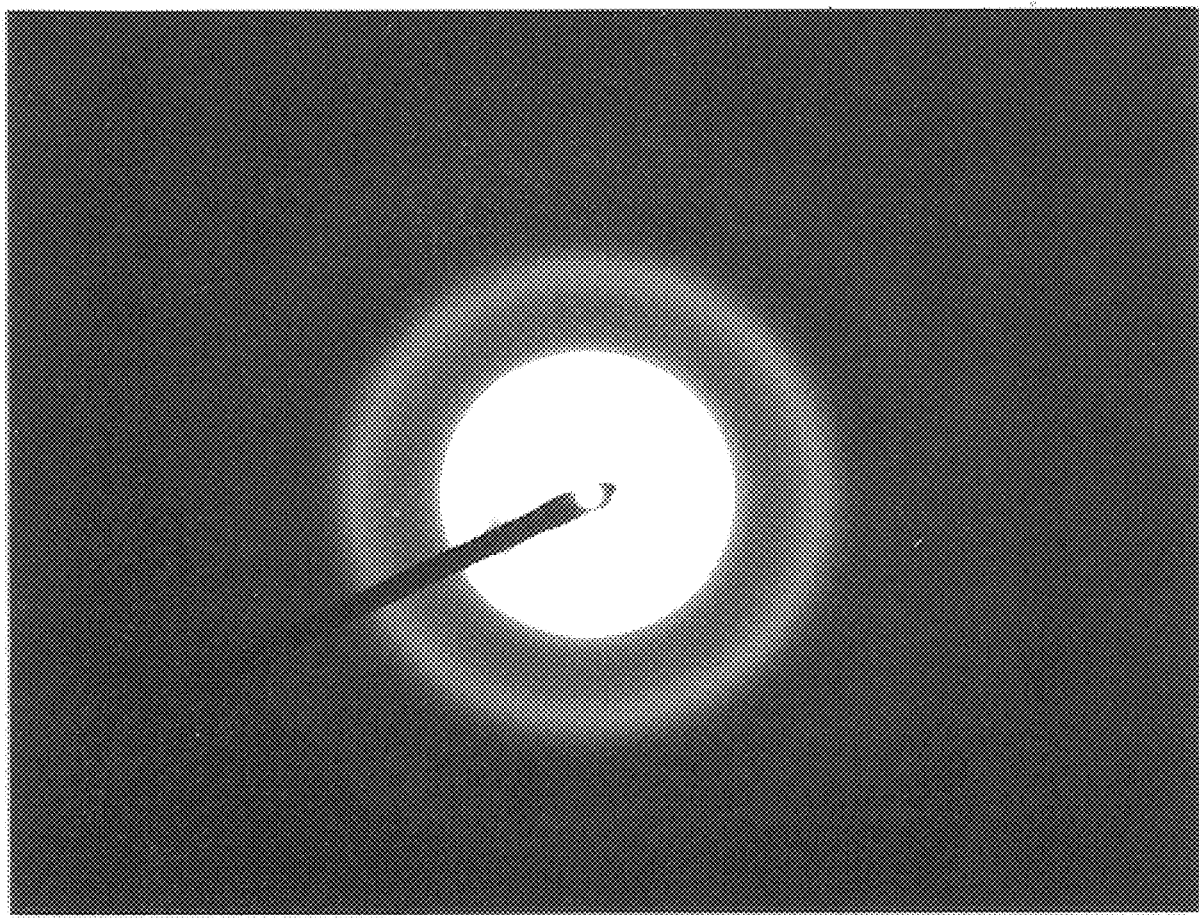
FIG. 29 is a view of an electron micrograph of the results of TEM observation (electron diffractograph) of a sample according to Comparative Example 2 of the present invention.

The diffractograph of the photograph shown in FIG. 29 shows that the sample remains amorphous.

Evaluation

Comparing Examples 3 and 4 and Comparative Example 2, it was found that, as shown in the above-mentioned Table 2, at a thickness of 40 nm, an energy density of 300 mJ/cm$^2$ is sufficient for obtaining a polycrystalline silicon thin film with a large grain size and that there is not that great a difference even if the energy density is made higher than that.

EXAMPLE 5

The same procedure was followed as in Example 1 to prepare a sample except that the thickness of the amorphous silicon film at the time deposition was made 80 nm, the laser energy density was made 350 mJ/cm$^2$, and laser annealing treatment was performed without performing substrate heating (that is, at room temperature). TEM observation was performed at the substantial center portion of the sample. The results of the TEM observation (bright-field image) are shown in FIG. 30.

Figure 30:
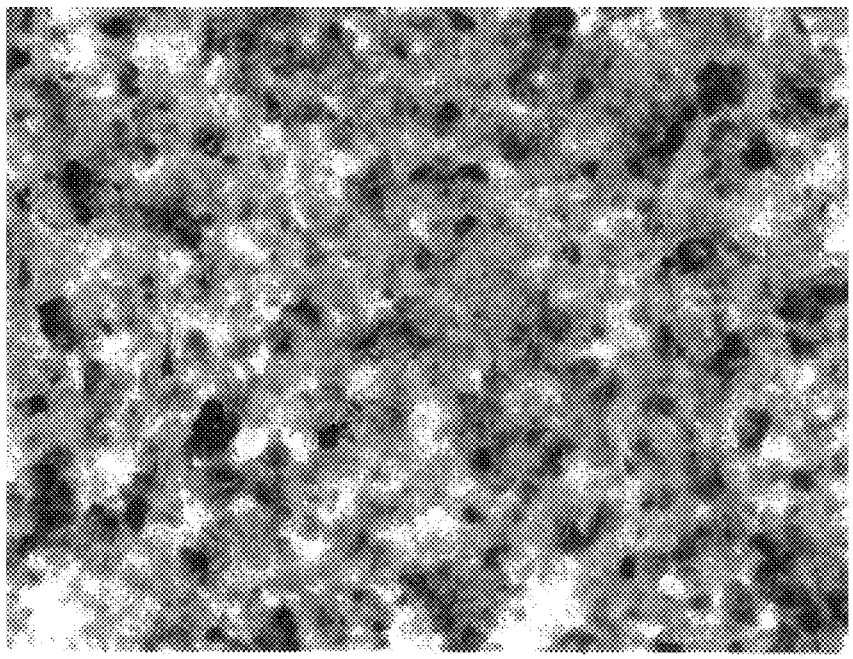
FIG. 30 is a view of an electron micrograph showing the results of TEM observation (bright-field image) of a polycrystalline silicon film according to Example 5 of the present invention.

Table 3 shows the results when finding the range of the grain size and average grain size in the polycrystalline silicon film (sample) from the photograph shown in FIG. 30.

TABLE 3

Dependency of Polycrystalline Silicon Grain Size on Number of Shots in Case of Thickness of 80 nm, No Substrate Heating (RT), and Excimer Laser Energy Density of 350 mJ/cm$^2$

|  | Ex. 5 | Ex. 6 | Ex. 7 |
| --- | --- | --- | --- |
| No. of shots | 1 | 101 | 100 |
| Grain size range (nm) | 20–70 | 20–70 | 20–70 |
| Average grain size (nm) | 40 | 40 | 40 |

EXAMPLE 6

The same procedure was followed as in Example 5 to prepare a sample except that the number of shots of the laser irradiated on the same sample was made 10. TEM observation was performed at the substantial center portion of the sample. The results of the TEM observation (bright-field image) are shown in FIG. 31.

Figure 31:
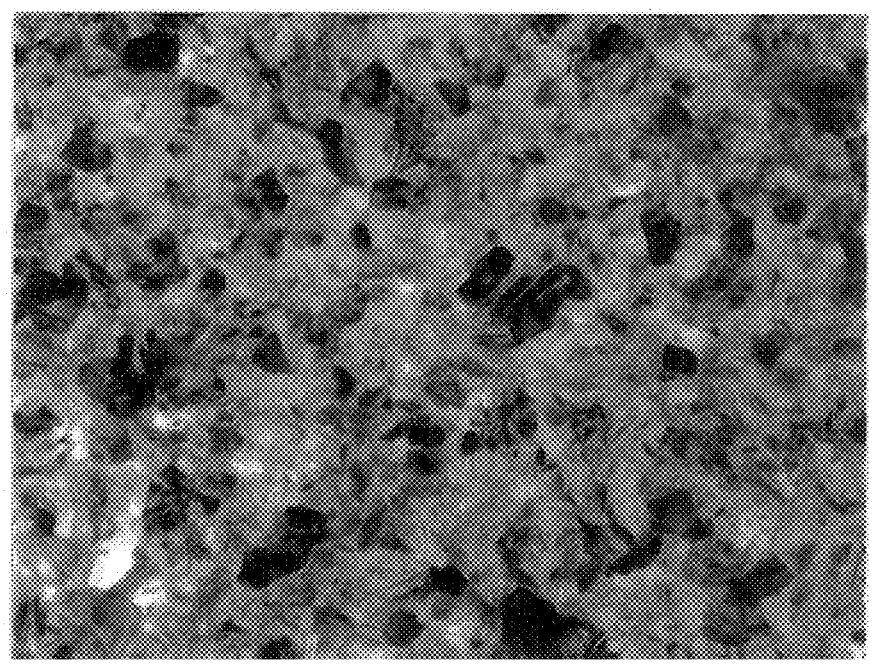
FIG. 31 is a view of an electron micrograph showing the results of TEM observation (bright-field image) of a polycrystalline silicon film according to Example 6 of the present invention.

Table 3 shows the results when finding the range of the grain size and average grain size in the polycrystalline silicon film (sample) from the photograph shown in FIG. 31.

EXAMPLE 7

The same procedure was followed as in Example 5 to prepare a sample except that the number of shots of the laser irradiated on the same sample was made 100. TEM observation was performed at the substantial center portion of the sample. The results of the TEM observation (bright-field image) are shown in FIG. 32.

Figure 32:
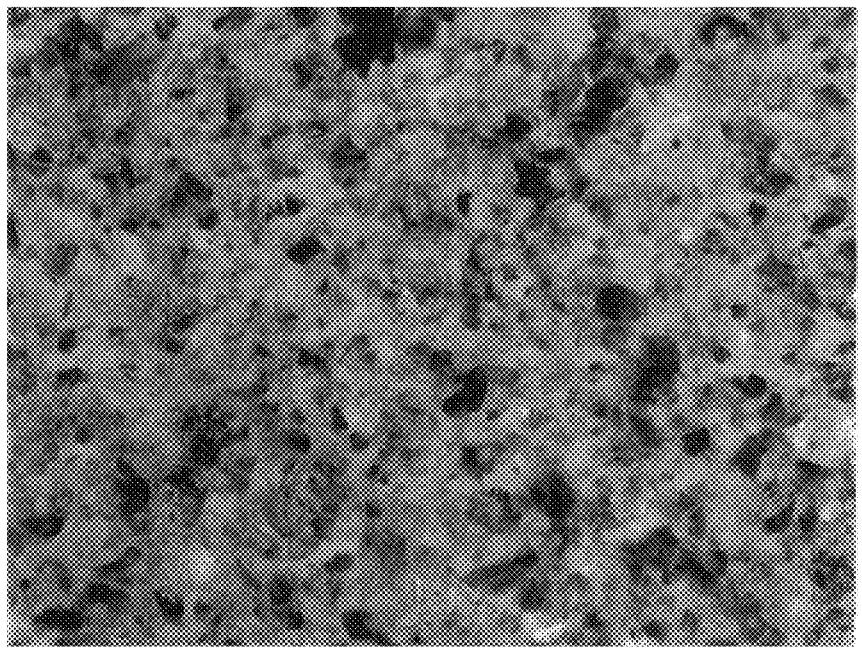
FIG. 32 is a view of an electron micrograph showing the results of TEN observation (bright-field image) of a polycrystalline silicon film according to Example 7 of the present invention.

Table 3 shows the results when finding the range of the grain size and average grain size in the polycrystalline silicon film (sample) from the photograph shown in FIG. 32.

Evaluation

Comparing Examples 5 to 7, it was found that, as shown in the above-mentioned FIGS. 30 to 32 and Table 3, the crystallinity and the grain size of the polycrystalline silicon thin film are not dependent on the number of shots. Accordingly, from the viewpoint of shortening of the production steps, a single shot of laser light is sufficient.

EXAMPLE 8

The same procedure was followed as in Example 1 to prepare a sample except that the thickness of the amorphous silicon film at the time of deposition was made 40 nm. TEM observation was performed at the substantial center portion of the sample. The results of the TEM observation (bright-field image) are shown in FIG. 33.

Figure 33:
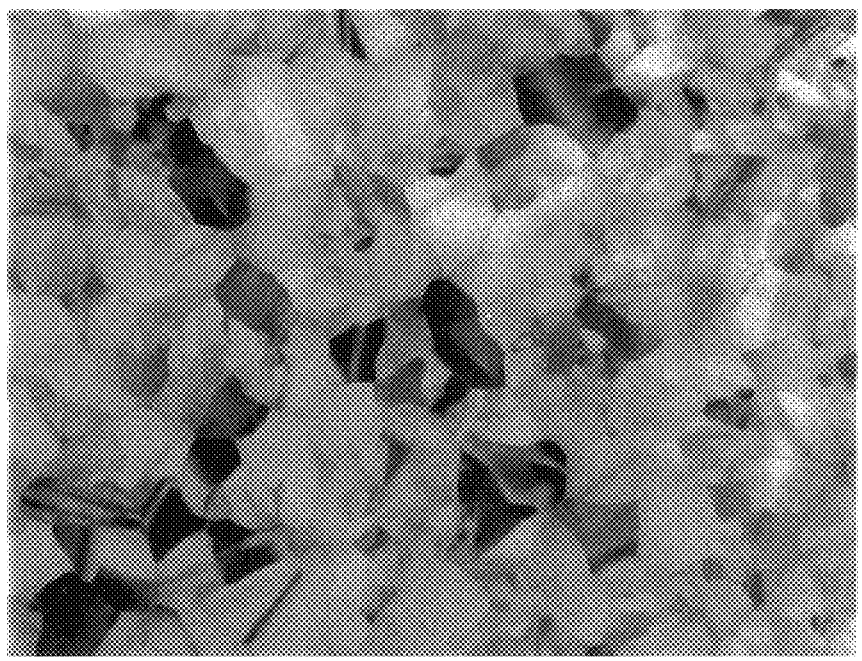
FIG. 33 is a view of an electron micrograph showing the results of TEM observation (bright-field image) of a polycrystalline silicon film according to Example 8 of the present invention.

Table 4 shows the results when finding the range of the grain size and average grain size in the polycrystalline silicon film (sample) from the photograph shown in FIG. 33.

TABLE 4

Dependency of Polycrystalline Silicon Grain Size on
Thickness in Case of Substrate Heating of 400° C., Excimer
Laser Energy Density of 350 mJ/cm², and Single Shot

|  | Ex. 8 | Ex. 9 |
|---|---|---|
| Thickness (nm) | 40 | 80 |
| Grain size range (nm) | 50–200 | 20–100 |
| Average grain size (nm) | 150 | 60 |

EXAMPLE 9

The same procedure was followed as in Example 8 to prepare a sample except that the thickness of the amorphous silicon film at the time of deposition was made 80 nm. TEM observation was performed at the substantial center portion of the sample. The results of the TEM observation (bright-field image) are shown in FIG. 34.

Figure 34:
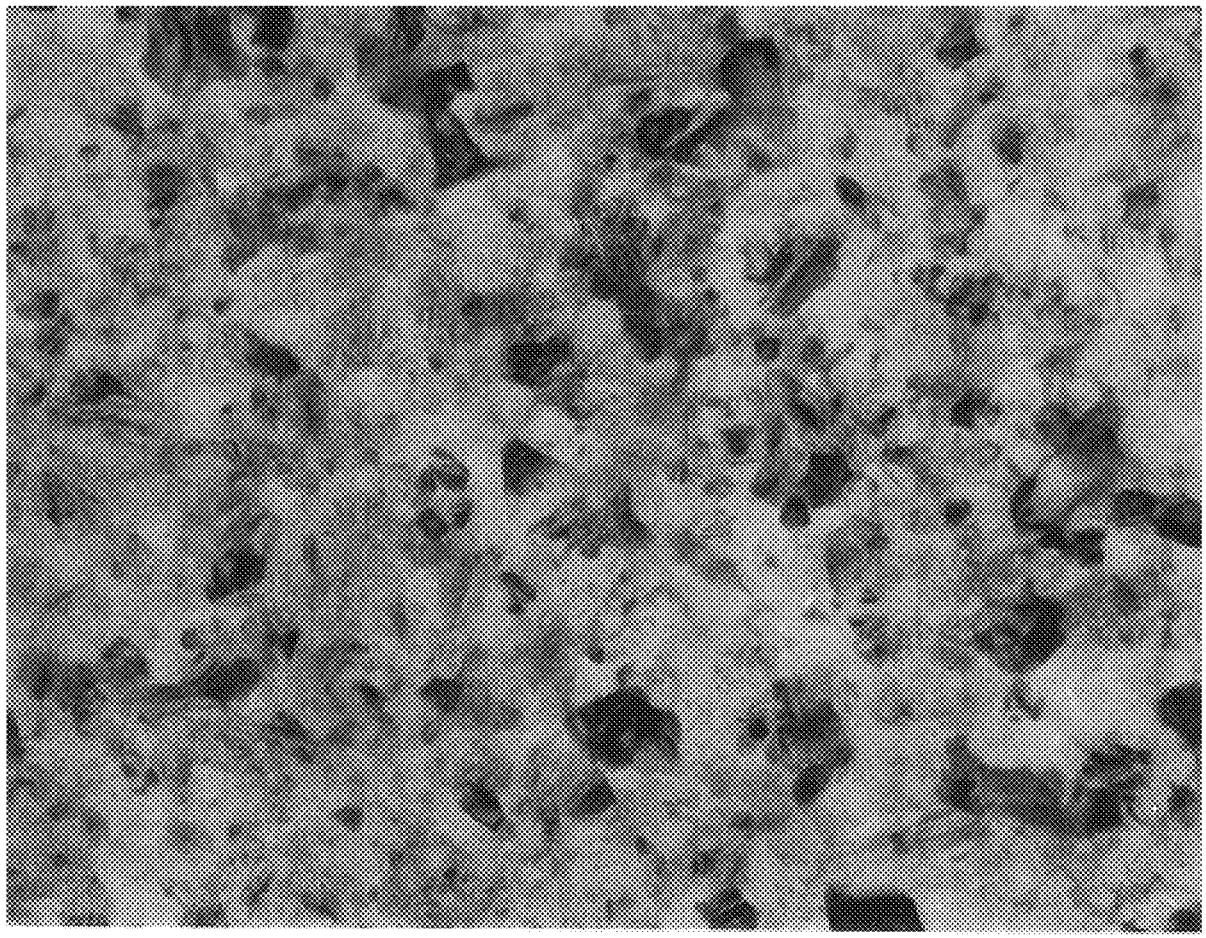
FIG. 34 is a view of an electron micrograph showing the results of TEM observation (bright-field image) of a polycrystalline silicon film according to Example 9 of the present invention.

Table 4 shows the results when finding the range of the grain size and average grain size in the polycrystalline silicon film (sample) from the photograph shown in FIG. 34.

Evaluation

Comparing Examples 8 and 9, it was found that, as shown in the above-mentioned FIGS. 33 and 34 and Table 4, at conditions the same except for the thickness, a small thickness of 40 nm is advantageous for obtaining a polycrystalline silicon thin film with a large grain size.

EXAMPLE 10

The same procedure was followed as in Example 1 to prepare a sample except that the thickness of the amorphous silicon film at the time deposition was made 40 nm, the laser energy density was made 300 mJ/cm², and laser annealing treatment was performed without performing substrate heating (that is, at room temperature). TEM observation was performed at the substantial center portion of the sample. The results of the TEM observation (bright-field image) are shown in FIG. 35.

Figure 35:
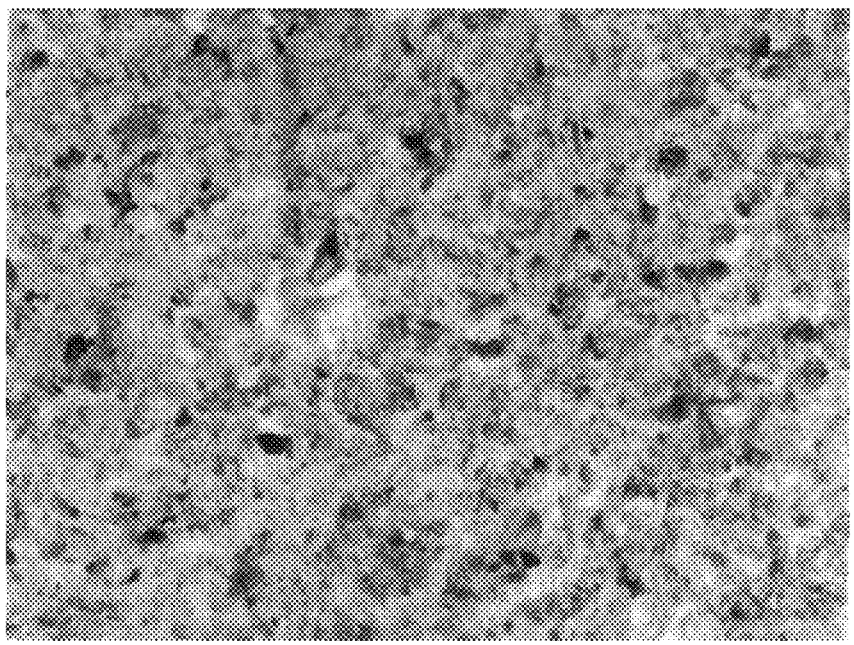
FIG. 35 is a view of an electron micrograph showing the results of TEM observation (bright-field image) of a polycrystalline silicon film according to Example 10 of the present invention.

Table 5 shows the results when finding the range of the grain size and average grain size in the polycrystalline silicon film (sample) from the photograph shown in FIG. 35.

TABLE 5

Dependency of polycrystalline Silicon Grain Size on
Substrate Heating in Case of Thickness of 40 nm, Excimer
Laser Energy Density of 350 mJ/cm², and Single Shot

|  | Ex. 10 | Ex. 11 |
|---|---|---|
| Substrate heating | RT | 400° C. |
| Grain size range (nm) | 20–50 | 50–200 |
| Average grain size (nm) | 20 | 150 |

EXAMPLE 11

The same procedure was followed as in Example 10 to prepare a sample except that the substrate heating temperature was made 400° C. TEM observation was performed at the substantial center portion of the sample. The results of the TEN observation (bright-field image) are shown in FIG. 36.

Figure 36:
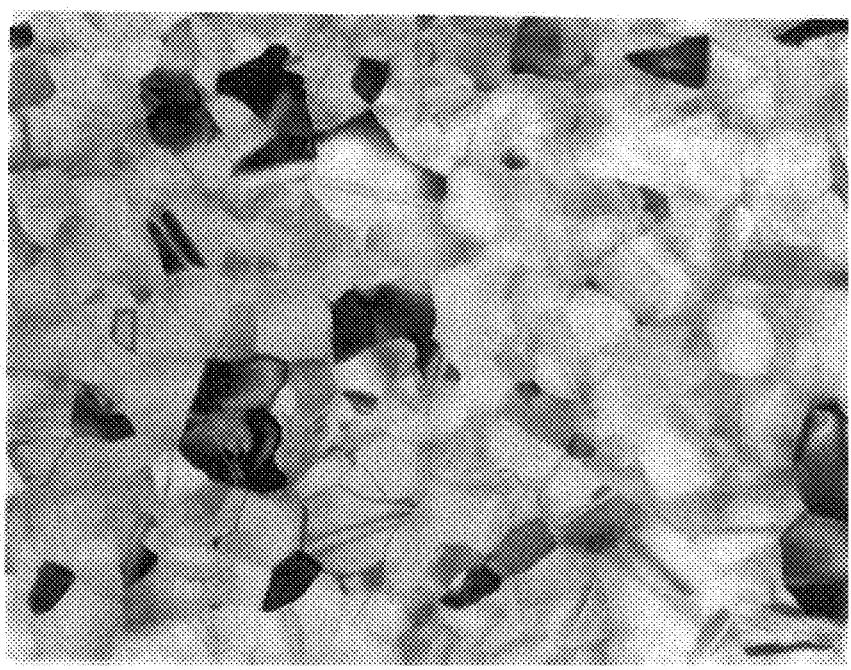
FIG. 36 is a view of an electron micrograph showing the results of TEN observation (bright-field image) of a polycrystalline silicon film according to Example 11 of the present invention.

Table 5 shows the results when finding the range of the grain size and average grain size in the polycrystalline silicon film (sample) from the photograph shown in FIG. 36.

EXAMPLE 12

The same procedure was followed as in Example 1 to prepare a sample except that the laser energy density was made 350 mJ/cm² and laser annealing treatment was performed without performing substrate heating (that is, at room temperature). TEM observation was performed at the substantial center portion of the sample. The results of the TEM observation (bright-field image) are shown in FIG. 37.

Figure 37:
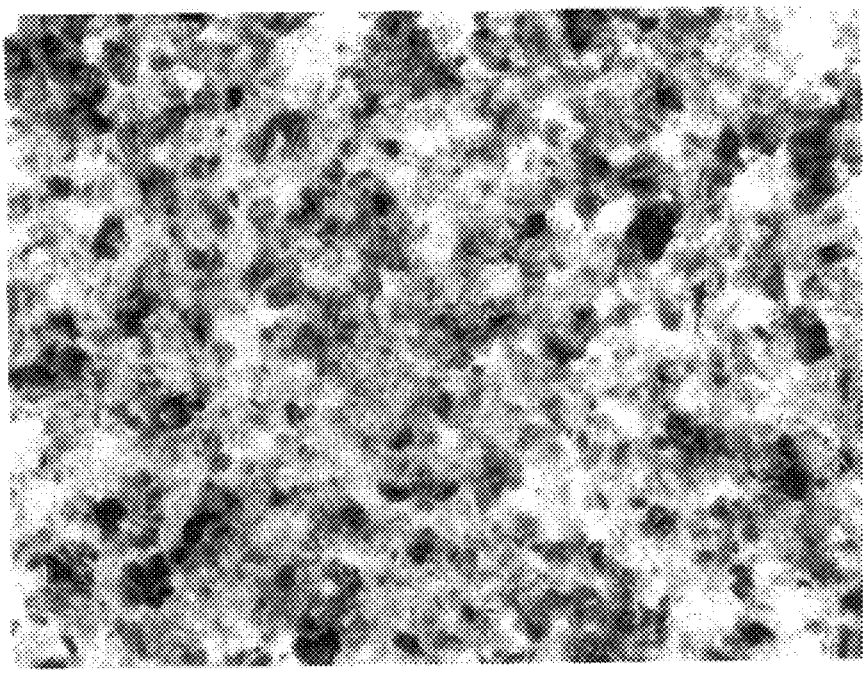
FIG. 37 is a view of an electron micrograph showing the results of TEM observation (bright-field image) of a polycrystalline silicon film according to Example 12 of the present invention.

Table 6 shows the results when finding the range of the grain size and average grain size in the polycrystalline silicon film (sample) from the photograph shown in FIG. 37.

TABLE 6

Dependency of Polycrystalline Silicon Grain Size on
Substrate Heating in Case of Thickness of 8O nm, Excimer
Laser Energy Density of 350 mJ/cm², and Single Shot

|  | Ex. 12 | Ex. 13 |
|---|---|---|
| Substrate heating | RT | 400° C. |
| Grain size range (nm) | 20–70 | 20–100 |
| Average grain size (nm) | 40 | 60 |

EXAMPLE 13

The same procedure was followed as in Example 12 to prepare a sample except that the substrate heating temperature was made 400° C. TEM observation was performed at the substantial center portion of the sample. The results of the TEM observation (bright-field image) are shown in FIG. 38.

Figure 38:
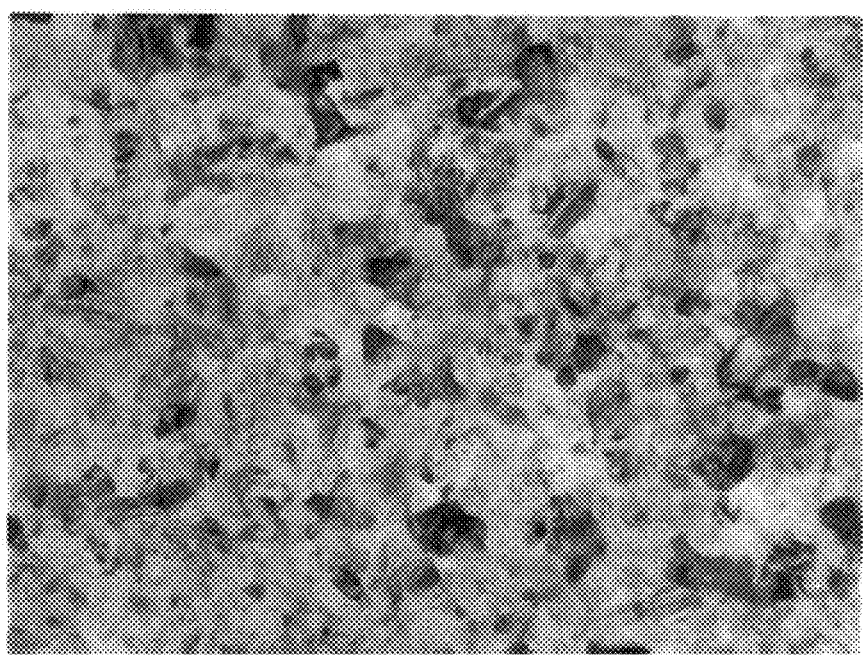
FIG. 38 is a view of an electron micrograph showing the results of TEM observation (bright-field image) of a polycrystalline silicon film according to Example 13 of the present invention.

Table 6 shows the results when finding the range of the grain size and average grain size in the polycrystalline silicon film (sample) from the photograph shown in FIG. 38.

Evaluation

As shown in the above-mentioned FIGS. 35 to 38 and Tables 5 and 6, when the only different condition was whether or not substrate heating was performed, it was found that a polycrystalline silicon film with a larger grain size can be obtained by performing substrate heating.

Further, the sample of Example 11 was examined as to the uniformity in the shot plane of the range of grain size and the average grain size. As a result, it was found that there was a tendency for the grains to be large at the center and for the grain size to become somewhat smaller than the center portion at the peripheral portions, but it was also found that this was of a range not posing a problem in the manufacture of a device.

As explained above, according to the method of formation of a polycrystalline silicon thin film of the present invention, it is possible to obtain a polycrystalline silicon thin film with a considerably large average grain size and small electron trap density at the grain boundaries and in the grains over a wide region of at least 3 cm×3 cm (about 10 cm²) by a single annealing treatment. Accordingly, if the obtained polycrystalline silicon thin film is used for a medium or small sized direct-view type liquid crystal display etc., mass production of high performance liquid crystal displays etc. becomes possible.

Further, according to the method of formation of a channel of a transistor according to the present invention, a transistor channel is formed in the polycrystalline silicon thin film formed by the method of formation of a polycrystalline silicon thin film, so the effect of the grain boundaries in the channel and the electron traps becomes smaller. Accordingly, the leakage current can become smaller, the variation in the threshold voltage greatly reduced, and the reliability of the transistor greatly improved.

Further, there is the effect that it is possible to reduce the variation in characteristics of the transistors.

What is claimed is:

1. A surface treatment method comprising the steps of:
providing a surface treatment apparatus including an illumination station having an associated x-axis and an orthogonal y-axis, a laser oscillator emitting laser light along an optical path, an attenuator in the optical path attenuating laser light passing through the attenuator, a scanner scanning the attenuated laser light directed at the illumination station in x-axis and y-axis directions, a beam homogenizer disposed between the scanner and the illumination station homogenizing laser light passing therethrough and a chamber disposed in the illumination station and positioned for illumination by said homogenized laser light;
placing a workpiece in the chamber;
providing an atmosphere within the chamber as necessary; and
surface treating the entire surface of the workpiece by stepwise irradiating rectangular surface portions of the workpiece in the chamber with at least one shot of homogenized rectangular beam of laser light having a pulse width of from about 80 ns to about 200 ns and having a total energy of at least 10 J such that rectangular surface portions of the workpiece are individually illuminated without forming overlapping exposed surface portions.

2. A surface treatment method as defined in claim 1, wherein said surface treating step is an annealing step for annealing the workpiece.

3. A surface treatment method as defined in claim 1, wherein in said atmosphere providing step, an atmosphere comprising an impurity is provided in said chamber and said surface treating step comprises introducing an impurity into the workpiece.

4. A surface treatment method as defined in claim 1, wherein in said atmosphere providing step, an oxidizing atmosphere is provided in said chamber and said surface treating step comprises forming an oxide layer on a surface of the workpiece.

5. A surface treatment method as defined in claim 1, wherein in said atmosphere providing step, a nitriding atmosphere is provided in the chamber and said surface treating step comprises forming a nitride layer on a surface of the workpiece.

6. A surface treatment method as defined in claim 1, wherein said workpiece comprises a substrate having a surface with an amorphous semiconductor layer and the surface treating step comprises forming a polycrystalline semiconductor layer from said amorphous semiconductor layer.

7. A surface treatment method as defined in claim 1, wherein said workpiece comprises a glass substrate having a surface with an amorphous semiconductor layer and the surface treating step comprises forming a polycrystalline semiconductor layer from said amorphous semiconductor layer.

8. A surface treatment method as defined in claim 1, wherein said workpiece comprises a substrate having a surface with an amorphous semiconductor layer and the surface treating step comprises forming a polycrystalline semiconductor layer from said amorphous semiconductor layer to define an active layer of an MOS transistor on the substrate.

9. A surface treatment method as defined in claim 1, wherein said workpiece comprises a substrate having a surface with source and drain regions for an MOS transistor formed thereon and said surface treating step comprises an activating step for activating the source and drain regions.

10. A surface treatment method as defined in claim 1, wherein the area of the workpiece illuminated in said shot has a square configuration.

11. A surface treatment method comprising:
forming an amorphous silicon layer having a thickness of from about 30 nm to about 50 nm on a substrate; and
irradiating the amorphous silicon layer with a laser light to form a polycrystalline silicon layer, said laser light having a pulse width of from about 80 ns to about 200 ns and a total energy of at least 5 J, said laser light having a configuration such that an area to be irradiated in a single shot of said laser light has a rectangular shape and said laser light is scanned to sequentially illuminate the amorphous silicon layer by illuminating one rectangular area of the amorphous silicon layer at a time so as to not form an overlap region of the laser light.

12. A surface treatment method as defined in claim 11, wherein said substrate comprises a glass substrate.

13. A surface treatment method as defined in claim 11, wherein said polycrystalline silicon layer comprises an active layer of an MOS transistor.

14. A surface treatment method as defined in claim 11, wherein in said irradiating step, activation of source and drain regions of an MOS transistor is achieved.

15. A surface treatment method as claimed in claim 11, further comprising a step of heating said amorphous silicon layer before or during said irradiating step.

16. A surface treatment method as defined in claim 11, wherein said amorphous silicon layer is heated to a temperature of from about 350° C. to about 450° C. before or during said irradiating step.

17. A surface treatment method as defined in claim 11, wherein said polycrystalline silicon layer comprises an active layer of a top gate MOS transistor.

18. A surface treatment method as defined in claim 11, wherein said polycrystalline silicon layer comprises an active layer of a bottom gate MOS transistor.

19. A surface treatment method as defined in claim 11, wherein in said forming step, the amorphous silicon layer is formed by a chemical vapor deposition at a temperature of less than about 500° C.

20. A surface treatment method as defined in claim 11, wherein said laser light has an energy density of from about 100 mJ/cm$^2$ to about 500 mJ/cm$^2$.

21. A surface treatment method as defined in claim 11, further comprising a step of forming a light reflection preventive film on a surface of said amorphous silicon layer before said irradiating step.

22. A surface treatment method as defined in claim 11, wherein said laser light emitted at least about 1 Pulse/sec.

23. A surface treatment method as defined in claim 11, wherein said laser light emitted at least about 20 Pulse/sec.

* * * * *